US012660240B2

(12) United States Patent
Ferng

(10) Patent No.: US 12,660,240 B2
(45) Date of Patent: Jun. 16, 2026

(54) SEMICONDUCTOR DEVICE AND METHOD OF MANUFACTURING

(71) Applicant: Taiwan Semiconductor Manufacturing Co., Ltd., Hsinchu (TW)

(72) Inventor: Shyh-Shin Ferng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 77 days.

(21) Appl. No.: 17/873,768

(22) Filed: Jul. 26, 2022

(65) Prior Publication Data

US 2022/0359766 A1      Nov. 10, 2022

Related U.S. Application Data

(62) Division of application No. 16/945,224, filed on Jul. 31, 2020, now Pat. No. 11,658,245.

(Continued)

(51) Int. Cl.
H10D 30/67          (2025.01)
H10D 30/01          (2025.01)
(Continued)

(52) U.S. Cl.
CPC ....... *H10D 30/6713* (2025.01); *H10D 30/031* (2025.01); *H10D 30/6729* (2025.01);
(Continued)

(58) Field of Classification Search
CPC ......... H01L 21/02532; H01L 21/02603; H01L 29/0673; H01L 29/42392; H01L 29/78696
See application file for complete search history.

(56) References Cited

U.S. PATENT DOCUMENTS 8,778,768 B1      7/2014      Chang et al.
9,209,247 B2      12/2015      Colinge et al.
(Continued)

FOREIGN PATENT DOCUMENTS

EP        2335285 B1      3/2016
TW        201719901 A     6/2017
TW        201828327 A     8/2018

OTHER PUBLICATIONS

Lee, Shen-Yang et al., "Experimental Demonstration of Performance Enhancement of MFMIS and MFIS for 5-nm×12.5-nm Poly-Si Nanowire Gate-All-Around Negative Capacitance FETs Featuring Seed-Layer and PMA-Free Process," 2019 Silicon Nanoelectronics Workshop (SNW), Jun. 9-10, 2019, 2 pages.

(Continued)

*Primary Examiner* — Brian Turner
(74) *Attorney, Agent, or Firm* — Slater Matsil, LLP

(57)      ABSTRACT

Gate-all-around (GAA) devices and methods of manufacturing such devices are described herein. A method includes forming a multi-layer structure over a substrate and forming a plurality of source/drain regions in the multi-layer structure. Fins are then patterned into the multi-layer structure through adjacent source/drain regions. A wire release process is performed to remove materials of one or more of the layers in the multi-layer stack. The remaining layers of the multi-layer stack form a stack of nanostructures connecting adjacent source/drain regions of the fins.

20 Claims, 28 Drawing Sheets

Related U.S. Application Data

(60) Provisional application No. 62/927,364, filed on Oct. 29, 2019.

(51) Int. Cl.

| | |
|---|---|
| *H10D 62/00* | (2026.01) |
| *H10D 62/10* | (2025.01) |
| *H10D 64/01* | (2025.01) |
| *H10D 64/62* | (2025.01) |
| *H10P 14/20* | (2026.01) |
| *H10P 50/64* | (2026.01) |

(52) U.S. Cl.

CPC ..... *H10D 30/6735* (2025.01); *H10D 30/6757* (2025.01); *H10D 62/021* (2025.01); *H10D 62/116* (2025.01); *H10D 62/121* (2025.01); *H10D 64/0112* (2026.01); *H10D 64/017* (2025.01); *H10D 64/62* (2025.01); *H10P 14/3411* (2026.01); *H10P 14/3462* (2026.01); *H10P 50/642* (2026.01)

(56) References Cited

U.S. PATENT DOCUMENTS

| | | | |
|---|---|---|---|
| 9,236,267 | B2 | 1/2016 | De et al. |
| 9,257,545 | B2 | 2/2016 | Leobandung |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,711,414 | B2 | 7/2017 | Hatcher et al. |
| 9,853,114 | B1 | 12/2017 | Rodder et al. |
| 9,905,643 | B1 | 2/2018 | Bergendahl et al. |
| 10,121,870 | B1 | 11/2018 | Chiang et al. |
| 10,453,967 | B2 | 10/2019 | Mehandru et al. |
| 2014/0225065 | A1* | 8/2014 | Rachmady ........... H01L 29/775 438/283 |
| 2014/0252413 | A1* | 9/2014 | Utomo ................. H10D 30/024 257/192 |
| 2014/0312427 | A1* | 10/2014 | Maeda ................. H10D 84/853 257/369 |
| 2016/0148936 | A1* | 5/2016 | Xu ......................... H01L 21/285 257/369 |
| 2017/0162583 | A1 | 6/2017 | Lee et al. |
| 2017/0179299 | A1 | 6/2017 | Bae |
| 2017/0213911 | A1* | 7/2017 | Balakrishnan ....... H10D 64/017 |
| 2018/0006139 | A1* | 1/2018 | Seo ..................... H01L 21/3065 |
| 2018/0090624 | A1 | 3/2018 | Cheng et al. |
| 2018/0108787 | A1 | 4/2018 | Cheng et al. |
| 2018/0190653 | A1* | 7/2018 | Lu ......................... H01L 29/165 |
| 2018/0301531 | A1 | 10/2018 | Xie |
| 2019/0165118 | A1 | 5/2019 | Leobandung |
| 2019/0214502 | A1* | 7/2019 | Xu ..................... H10D 30/0323 |
| 2019/0341450 | A1* | 11/2019 | Lee ................. H01L 21/823864 |
| 2020/0219774 | A1* | 7/2020 | Jambunathan ...... H01L 29/1079 |
| 2020/0350215 | A1 | 11/2020 | Zhang et al. |
| 2021/0020524 | A1 | 1/2021 | Wang et al. |

OTHER PUBLICATIONS

Xu, F., et al., "Designing a Practical Access Point Association Protocol," IEEE Infocom 2010 Proceedings, downloaded on Aug. 11, 2010, 9 pages.

* cited by examiner

Figure 5B

SEMICONDUCTOR DEVICE AND METHOD OF MANUFACTURING

PRIORITY CLAIM AND CROSS-REFERENCE

This application is a divisional of U.S. patent application Ser. No. 16/945,224, now U.S. Pat. No. 11,658,245, issued May 23, 2023, entitled: "Semiconductor Device and Method of Manufacturing," filed on Jul. 31, 2020, which claims the benefit of U.S. Provisional Application No. 62/927,364 entitled: "Foundation Design to Enhance OCD Accuracy on Nano-Sheet Measurement," filed on Oct. 29, 2019, which are hereby incorporated by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B illustrate the formation of spacers adjacent the dummy gate stacks and source/drain regions of the multi-layer structure, in accordance with some embodiments.

DETAILED DESCRIPTION

Figure 1:
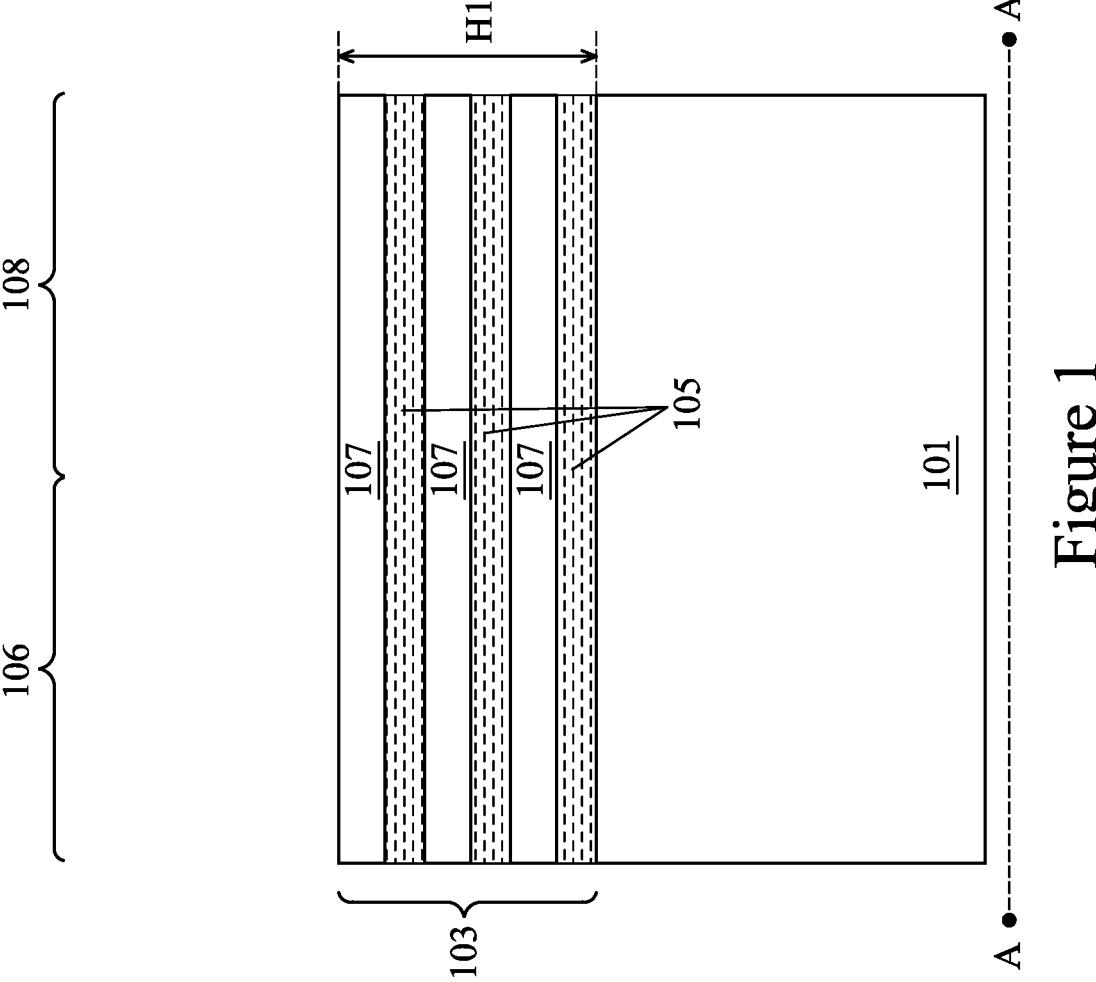
FIG. 1 illustrates the formation of a multi-layer structure in an intermediate step of forming a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, this figure illustrates the formation of a multi-layer structure 100 in an intermediate step of forming a semiconductor device, in accordance with some embodiments. In particular, FIG. 1 illustrates a substrate 101 into which dopants have been implanted in order to form wells. In an embodiment the substrate 101 is a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). Substrate 101 may be doped or un-doped. In some embodiments, substrate 101 may be a bulk semiconductor substrate, such as a bulk silicon substrate that is a wafer, a semiconductor-on-insulator (SOI) substrate, a multi-layered or gradient substrate, or the like.

FIG. 1 further illustrates that the substrate 101 comprises a first device region 106 for forming n-type devices, such as NMOS transistors (e.g., n-type gate all around transistors) and a second device region 108 for forming p-type devices, such as PMOS transistors (e.g., p-type gate all around transistors). To separate the first device region 106 and the second device region 108, wells (not separately illustrated in FIG. 1) may be formed within the substrate 101 with n-type dopants and p-type dopants. To form the desired wells, the n-type dopants and the p-type dopants are implanted into the substrate 101 depending upon the devices that are desired to be formed. For example, n-type dopants such as phosphorous or arsenic may be implanted to form n-type wells, while p-type dopants such as boron may be implanted to form p-type wells. The n-type wells and p-type wells may be formed using one or more implantation techniques such as diffusion implantations, ion implantations (e.g., plasma doping, beam line implant doping), selective implantations, deep-well implantations, and the like, or combinations thereof. Masking techniques may also be utilized to mask some regions (e.g., second device region 108) of the substrate 101 while exposing other regions (e.g., first device region 106) of the substrate 101 during a first well implantation (e.g., n-type wells) process.

Once the first well implantation process has been completed, the mask is removed to expose the previously masked regions (e.g., second device region 108) and another mask may be placed over the previously exposed regions (e.g., first device region 106) during a second well implantation (e.g., p-type wells) process. In some embodiments, further doping implantations may be performed to form deep well implant regions within the substrate 101.

FIG. 1 further illustrates a deposition process to form the multi-layer structure 100 in an intermediate stage of manufacturing the Gate All-Around (GAA) device, according to some embodiments. In particular, FIG. 1 further illustrates a series of depositions that are performed to form a multi-layer stack 103 of alternating materials of first layers 105 and second layers 107 over the substrate 101.

According to some embodiments, the first layers 105 may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer of the first layers 105 is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer 105 is formed to thicknesses of between about 4 nm and about 20 nm, such as about 10 nm. However, any suitable thickness may be utilized while remaining within the scope of the embodiments.

Once the first layer 105 has been formed over the substrate 101, a second layer 107 may be formed over the first layer 105. According to some embodiments, the second layers 107 may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer 105. In a particular embodiment in which the first layer 105 is silicon germanium, the second layer 107 is a material such as silicon. However, any suitable combination of materials may be utilized for the first layers 105 and the second layers 107.

In some embodiments, the second layer 107 is epitaxially grown on the first layer 105 using a deposition technique similar to that used to form the first layer 105. However, the second layer 107 may use any of the deposition techniques suitable for forming the first layer 105, as set forth above or any other suitable technique. According to some embodiments, the second layer 107 is formed to a similar thickness to that of the first layer 105. However, the second layer 107 may also be formed to a thickness that is different from the first layer 105. According to some embodiments, the second layer 107 may be formed to a thickness of between about 4 nm and about 20 nm, such as about 10 nm. However, any suitable thickness may be used.

Once the second layer 107 has been formed over the first layer 105, the deposition process is repeated to form the remaining material layers in the series of alternating materials of the first layers 105 and the second layers 107 until a desired topmost layer of the multi-layer stack 103 has been formed. According to the present embodiment, the first layers 105 may be formed to a same or similar first thickness and the second layers 107 may be formed to the same or similar first thickness. However, the first layers 105 may have different thicknesses from one another and/or the second layers 107 may have different thicknesses from one another and any combination of thicknesses may be used for the first layers 105 and the second layers 107. According to the present embodiment, the topmost layer of the multi-layer stack 103 is formed as a second layer 107; however, in other embodiments, the topmost layer of the multi-layer stack 103 may be formed as a first layer 105. Additionally, although embodiments are disclosed herein comprising three of the first layers 105 and three of the second layers 107, the multi-layer stack 103 may have any suitable number of layers (e.g., nanosheets). For example, the multi-layer stack 103 may comprise multiple nanosheets in a range between 2 to 10 nanosheets. In some embodiments, the multi-layer stack 103 may comprise equal numbers of the first layers 105 to the second layers 107; however, in other embodiments, the number of the first layers 105 may be different from the number of the second layers 107. According to some embodiments, the multi-layer stack 103 may be formed to a first height H1 of between about 24 nm and about 120 nm, such as about 60 nm. However, any suitable height may be used.

Figure 2A:
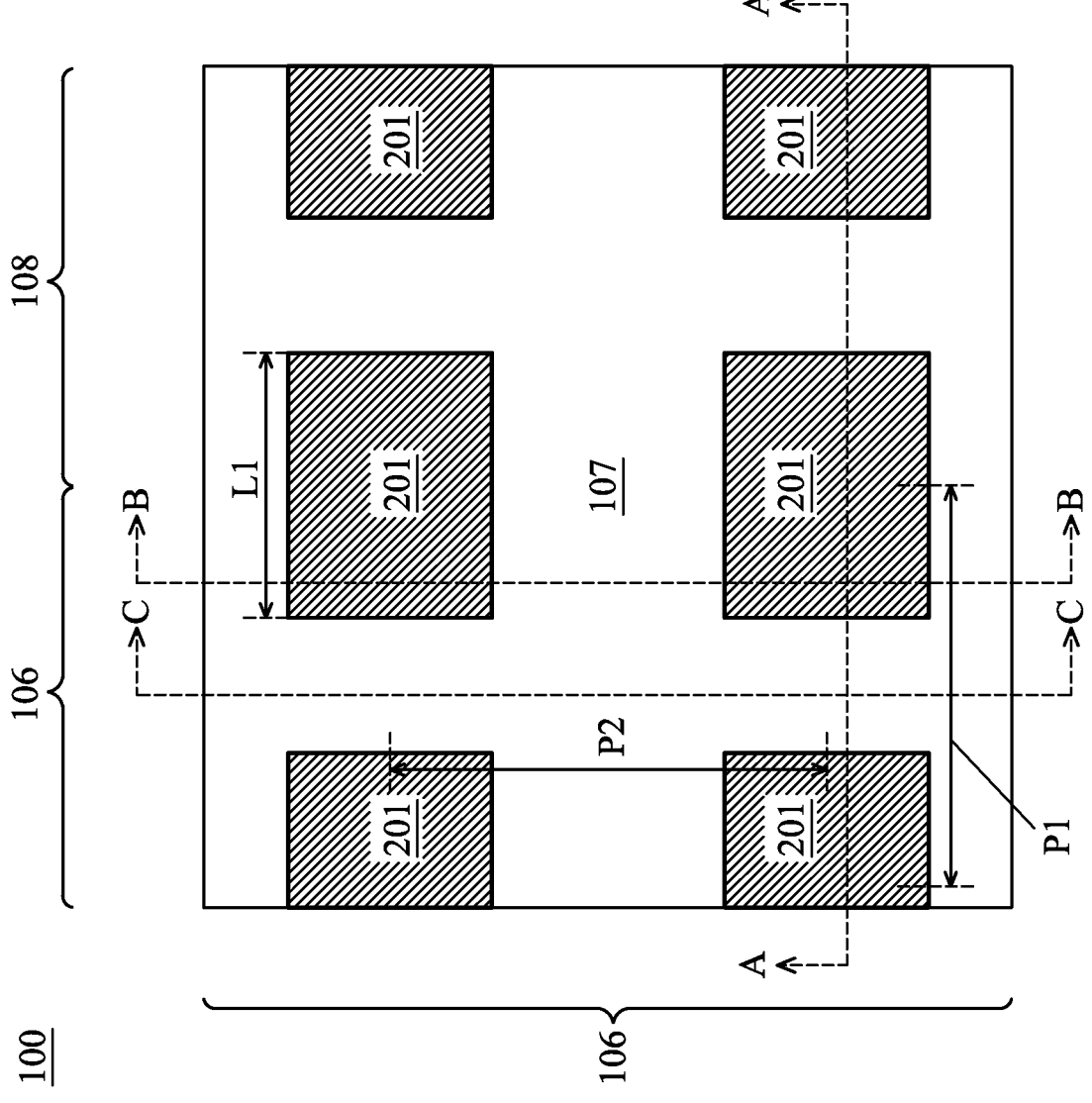
FIGS. 2A-2D illustrate the formation of source/drain regions in the multi-layer structure, in accordance with some embodiments.

With reference now to FIG. 2A, this figure illustrates a patterning process in a top-down view of the multi-layer structure 100 in an intermediate stage of manufacturing the Gate All-Around (GAA) devices, in accordance with some embodiments. In an embodiment the multi-layer stack 103 is formed from semiconductor materials that can work with the substrate 101 to help form nanostructures (e.g., nanosheets, nanowires, or the like) for the Gate All-Around (GAA) devices. The patterning process, according to some embodiments, comprises applying one or more masks and a photoresist over the multi-layer stack 103 and then developing and etching the photoresist to form a mask over the multi-layer stack 103. Once formed, the mask is then used during an etching process, such as an anisotropic etching process to transfer the pattern of the mask into the underlying layers and form openings in the multi-layer structure 100.

Once the openings have been formed in the multi-layer structure 100, source/drain regions 201 may be formed within the openings. According to some embodiments, the source/drain regions 201 may be formed using a growth process such as a selective epitaxial process with a semiconductor material suitable for the device desired to be formed. For example, in an embodiment in which the source/drain regions 201 are utilized to form an NMOS device, the source/drain regions 201 may be a semiconductor material such as silicon, silicon phosphorous, silicon carbon phosphorous, combinations of these, or the like. According to a particular embodiment, the source/drain regions 201 are silicon. The epitaxial growth process may use precursors such as silane, dichlorosilane, germane, and the like, and may continue for between about 5 minutes and about 120 minutes, such as about 30 minutes. The epitaxial growth process may continue until the semiconductor material of the source/drain regions 201 fills and/or overfills the openings. Once the epitaxial growth process has been completed, the semiconductor material of the source/drain regions 201 outside of the openings is removed using a process such as chemical mechanical planarization (CMP), according to some embodiments. However, any other suitable process may also be used.

Once the material for the source/drain regions 201 have been formed, dopants may be implanted into the source/drain regions 201 by implanting appropriate dopants to complement the dopants within the remainder of the first device region 106. For example, n-type dopants such as phosphorous (P), carbon (C), arsenic (As), silicon (Si), antimony (Sb), or the like, and combinations thereof (e.g., SiP, SiC, SiPC, SiAs, Si, Sb, etc.) may be implanted to form NMOSFET devices.

In another embodiment, the dopants of the source/drain regions 201 may be placed during the epitaxial growth of the source/drain regions 201. For example, phosphorous may be placed in situ as the source/drain regions 201 are being formed. Any suitable process for placing the dopants within the source/drain regions 201 may be utilized, and all such processes are fully intended to be included within the scope of the embodiments. Furthermore, an anneal process may be performed to activate the dopants within the source/drain regions 201. During the anneal process, dopants of the source/drain regions 201 may laterally diffuse into the second layers 107. As such, lightly doped drain (LDD) regions may be formed within the second layers 107 of the first device region 106.

According to some embodiments, the source/drain regions 201 are formed with straight sidewalls from a top surface of the source/drain regions 201 to a bottom surface of the source/drain regions 201. As such, the source/drain regions 201 will maintain a shape (e.g., a rectangular shape, a square shape, a circular shape, etc.) as the source/drain regions 201 extend from a bottom surface of the source/drain regions 201 to a top surface of the source/drain regions 201. As such, the source/drain regions 201 may be formed to have consistent first length L1 of between about 10 nm and about 200 nm, such as about 40 nm. However, any suitable lengths may be used. Furthermore, the source/drain regions 201 may be spaced apart by a first pitch P1 between lengths of adjacent ones of the source/drain regions 201. According to some embodiments, the first pitch P1 may be between about 20 nm and about 150 nm, such as about 40 nm, although any suitable pitch may be used. The source/drain regions 201 may be formed to a first width W1 of between about 5 nm and about 100 nm, such as about 20 nm, according to some embodiments. However, any suitable widths may be used. Furthermore still, the source/drain regions 201 may be spaced apart by a second pitch P2 between widths of adjacent ones of the source/drain regions 201. According to some embodiments, the second pitch P2 may be between about 40 nm and about 180 nm, such as about 50 nm, although any suitable pitch may be used.

FIG. 2A further illustrates a first cutline A-A, a second cutline B-B and a third cutline C-C that cut through the multi-layer structure 100 and will be referenced in the discussions of the following figures, in accordance with some embodiments. In particular, the first cutline A-A extends through three of the source/drain regions 201 in a direction of the lengths of the source/drain regions 201. The second cutline B-B extends through two of the source/drain regions 201 in a direction of the widths of the source/drain regions 201. The third cutline C-C extends between two sets of adjacent ones of the source/drain regions 201 in a direction of the widths of the source/drain regions 201.

Figure 2B:
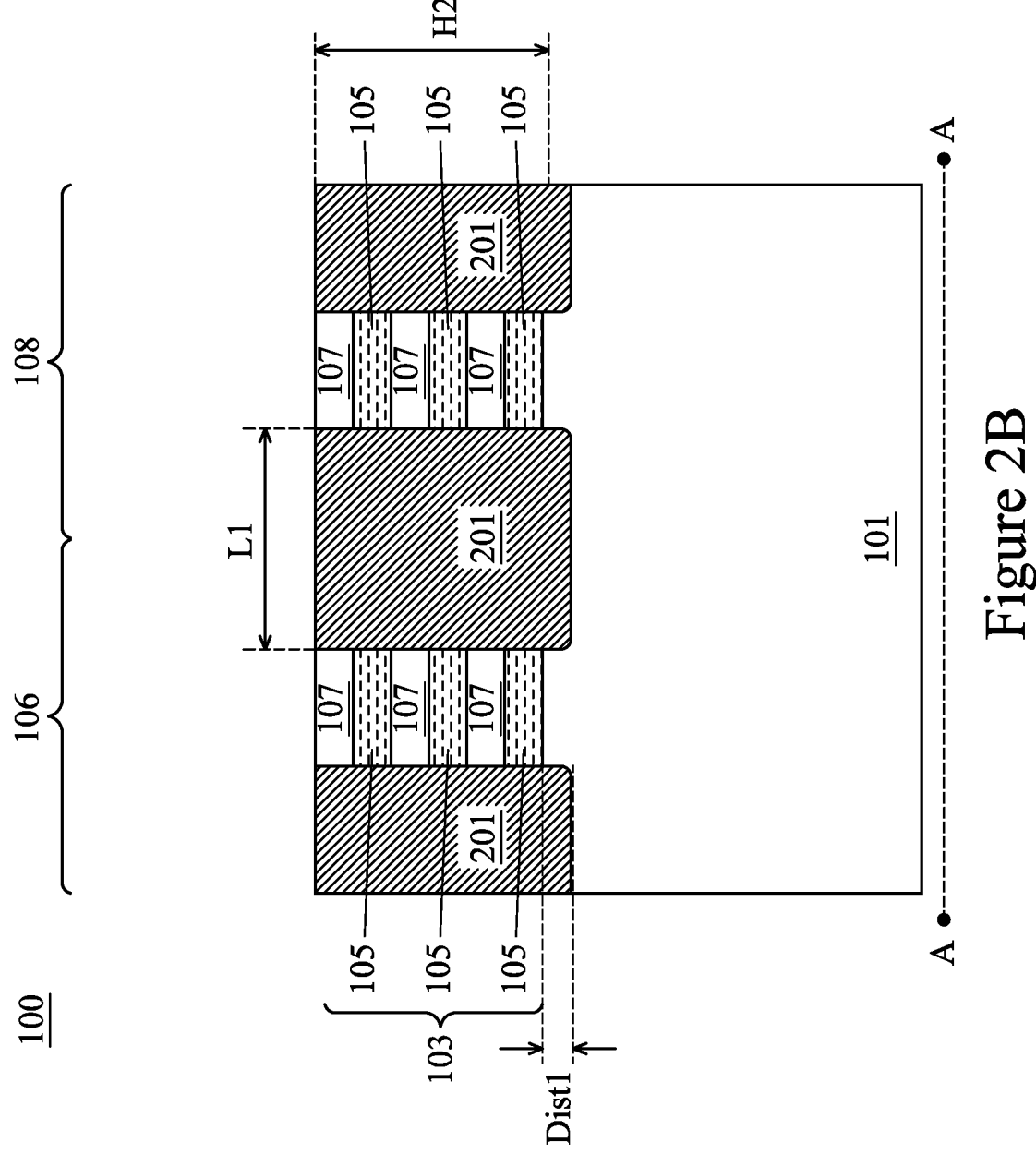

FIG. 2B illustrates a cross-sectional view of the multi-layer structure 100 taken through the first cutline A-A. FIG. 2B illustrates three of the source/drain regions 201 extending into the substrate 101. According to some embodiments, the source/drain regions 201 are formed to a second height H2 of between about 300 nm and about 40 nm, such as about 100 nm, although any suitable height may be used. FIG. 2B further illustrates that the source/drain regions 201 extend into the substrate 101 a first distance Dist1 below the multi-layer stack 103. According to some embodiments, the first distance Dist1 is a distance of between about 1 nm and about 100 nm, such as about 10 nm. However, any suitable distance may be used. Although the source/drain regions 201 are all formed to the second height H2 in this embodiment, the source/drain regions 201 may also be formed to different heights. For example, the source/drain regions 201 of the second device region 108 may be formed to a different height than the source/drain regions 201 of the first device region 106.

Figure 2C:
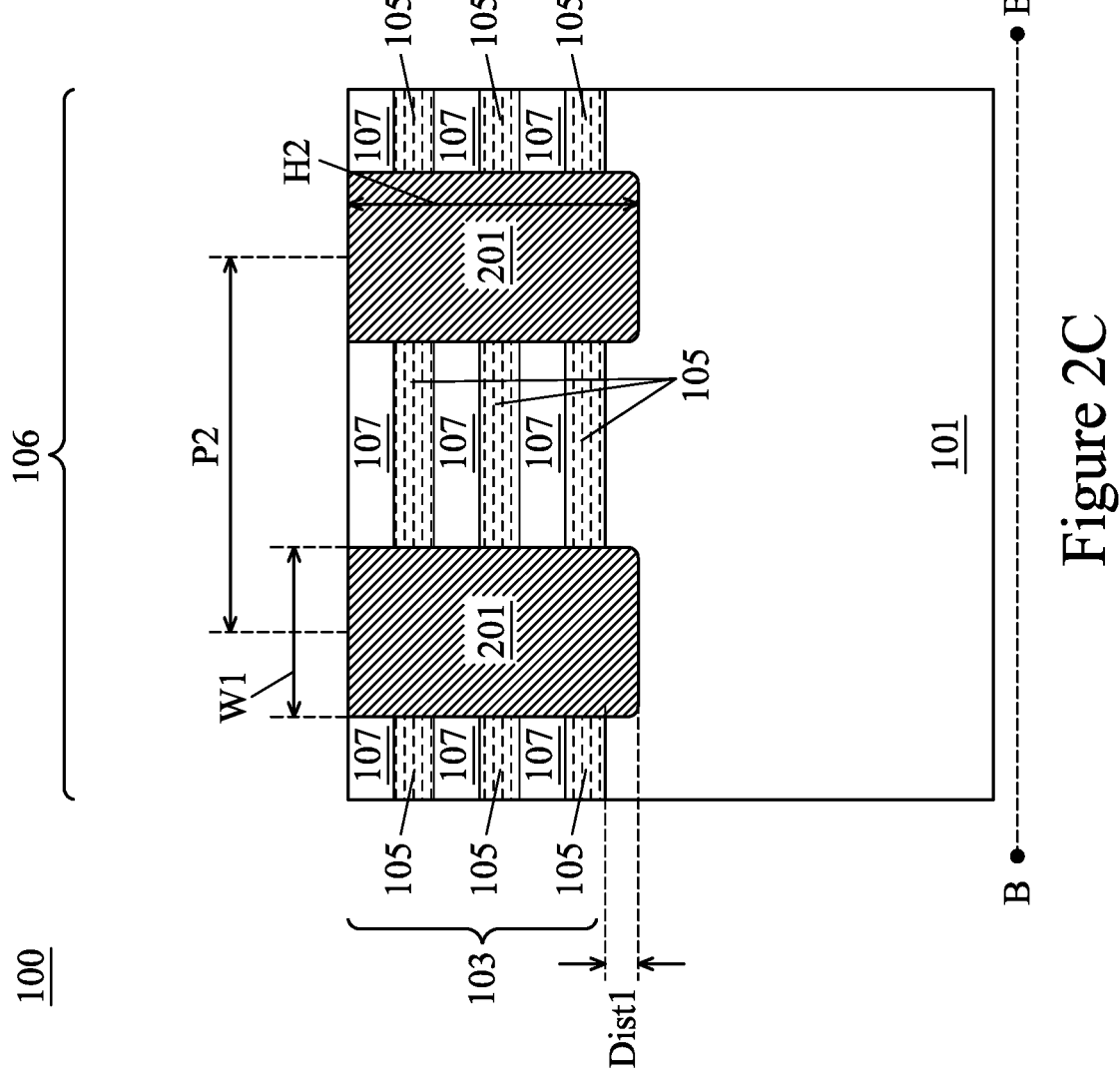

FIG. 2C illustrates a cross-sectional view of the multi-layer structure 100 taken through the second cutline B-B. The two source/drain regions 201 are both located in the first device region 106. According to some embodiments, the source/drain regions 201 are formed to the second height H2 and extend into the substrate 101 the first distance Dist1 below the multi-layer stack 103. However, any suitable height and distance may be used.

Figure 2D:
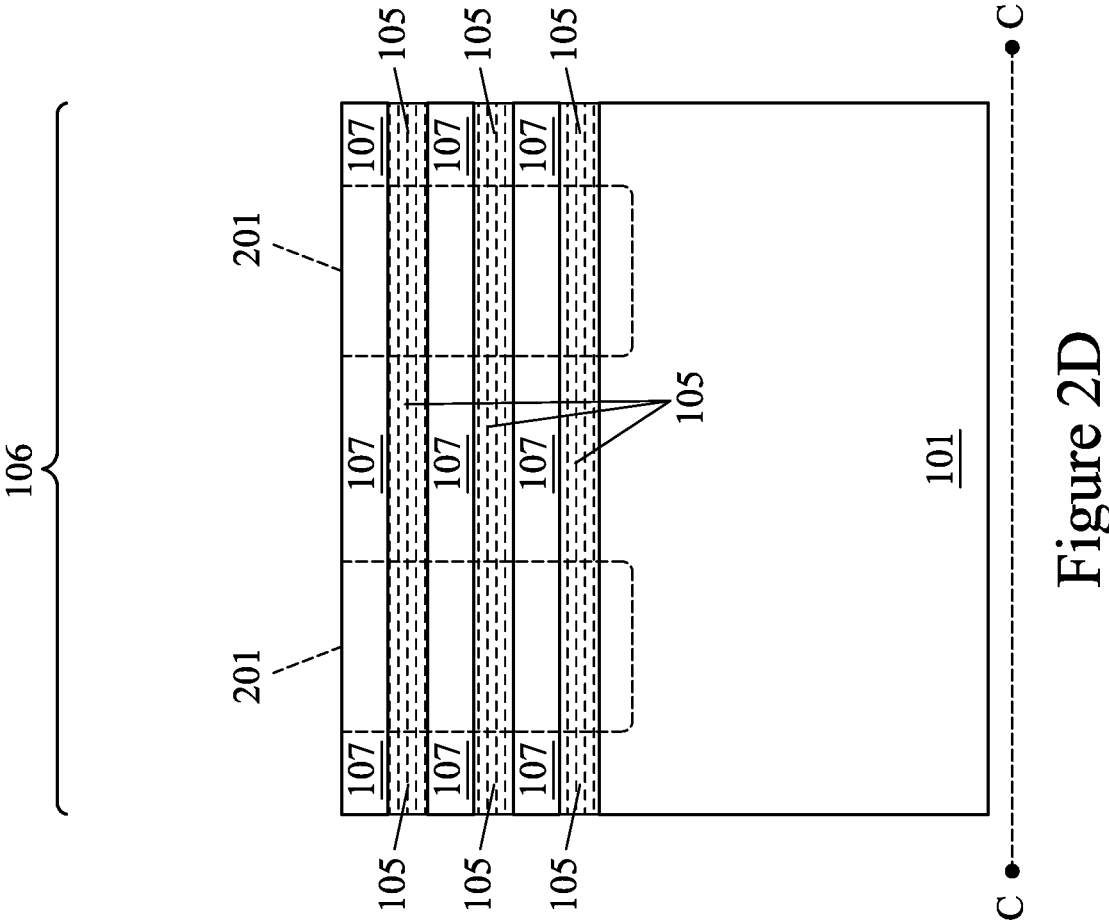

FIG. 2D illustrates a cross-sectional view of the multi-layer structure 100 taken through the third cutline C-C. FIG. 2D illustrates the multi-layer stack 103 with the two source/drain regions 201 of FIG. 2C being hidden from view as indicated by the dashed lines.

Figure 3A:
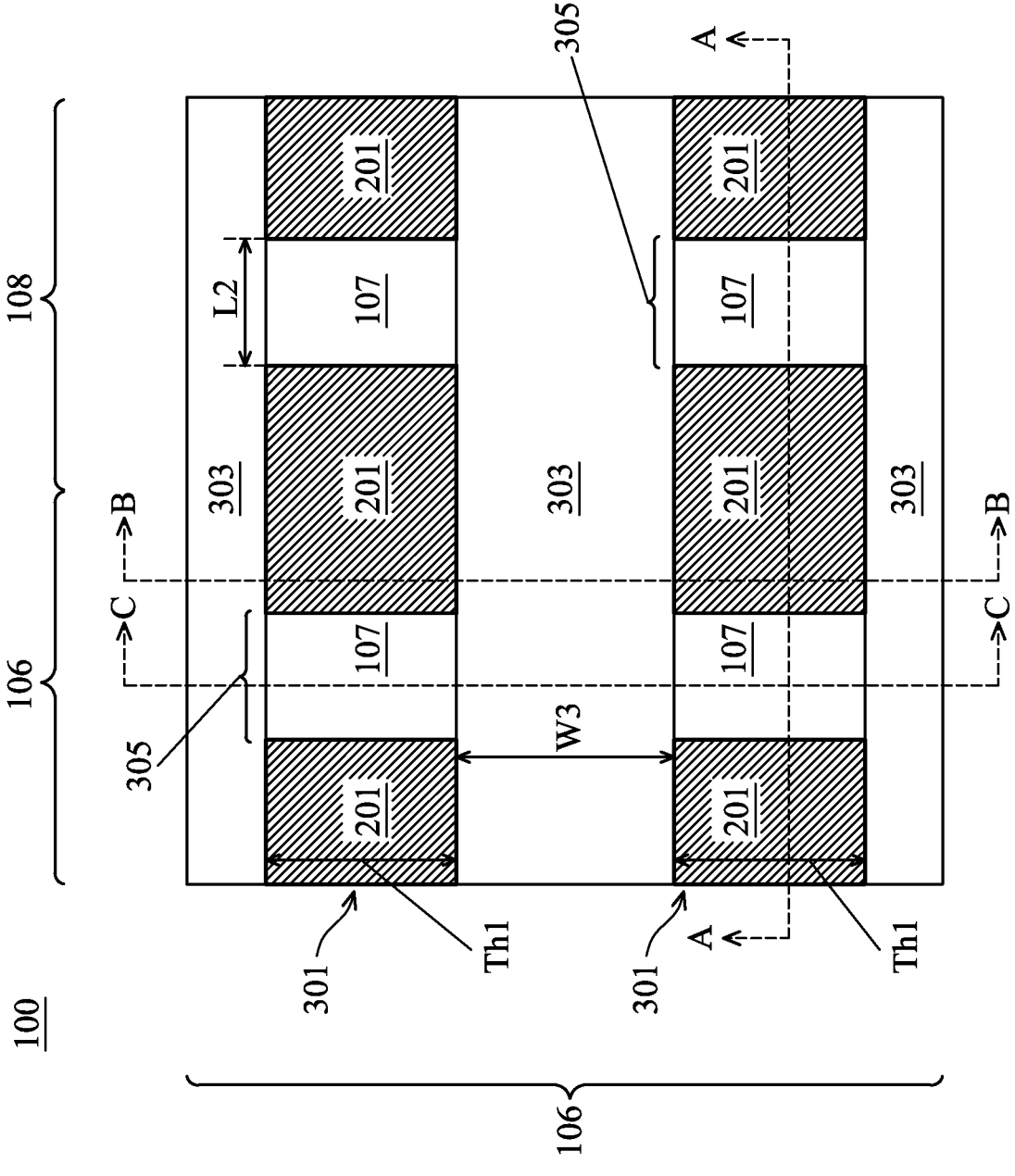
FIGS. 3A-3B illustrate the formation of fins and isolation regions in the multi-layer structure, in accordance with some embodiments.

FIG. 3A illustrates, in the top-down view, a patterning process of the multi-layer structure 100 and a formation of isolation regions 303 in an intermediate stage of manufacturing Gate All-Around (GAA) devices, in accordance with some embodiments. The patterning process is used to form the fins 301 in the multi-layer structure 100. According to some embodiments, two of the fins 301 are patterned in the multi-layer structure 100 using two rows of adjacent ones of the source/drain regions 201 to form the fins 301. According to some embodiments, the first thickness Th1 is between about 5 nm and about 150 nm, such as about 20 nm.

Although each row of adjacent ones of the source/drain regions 201 is shown in FIG. 3A to be patterned into a single fin, in other embodiments, each row of adjacent ones of the source/drain regions 201 may be patterned into two or more of the fins 301. Furthermore, any suitable number of rows of adjacent ones of the source/drain regions 201 may be formed into the multi-layer structure 100 and each of the rows may be patterned into any suitable number of the fins 301. The formation of the fins 301 will be discussed in greater detail below with regard to the following figures.

The remaining portions of the multi-layer stack 103, once the fins 301 have been formed, define the channel regions 305 within the fins 301, the channel regions 305 being separated by the source/drain regions 201. The channel regions 305 are defined to have a second length L2 and the first thickness Th1. According to some embodiments, the second length L2 may be between about 5 nm and about 100 nm, such as about 10 nm. However, any suitable length and any suitable thickness may be used.

Once the fins 301 have been formed, the isolation regions 303 are formed over the substrate 101 and separate the fins 301 from one another. The isolation regions 303 may be formed to a third width W3 of between about 15 nm and about 150 nm, such as about 30 nm, although any suitable width may be used. The formation of the isolation regions 303 will be discussed in greater detail below with regard to the following figures.

Figure 3B:
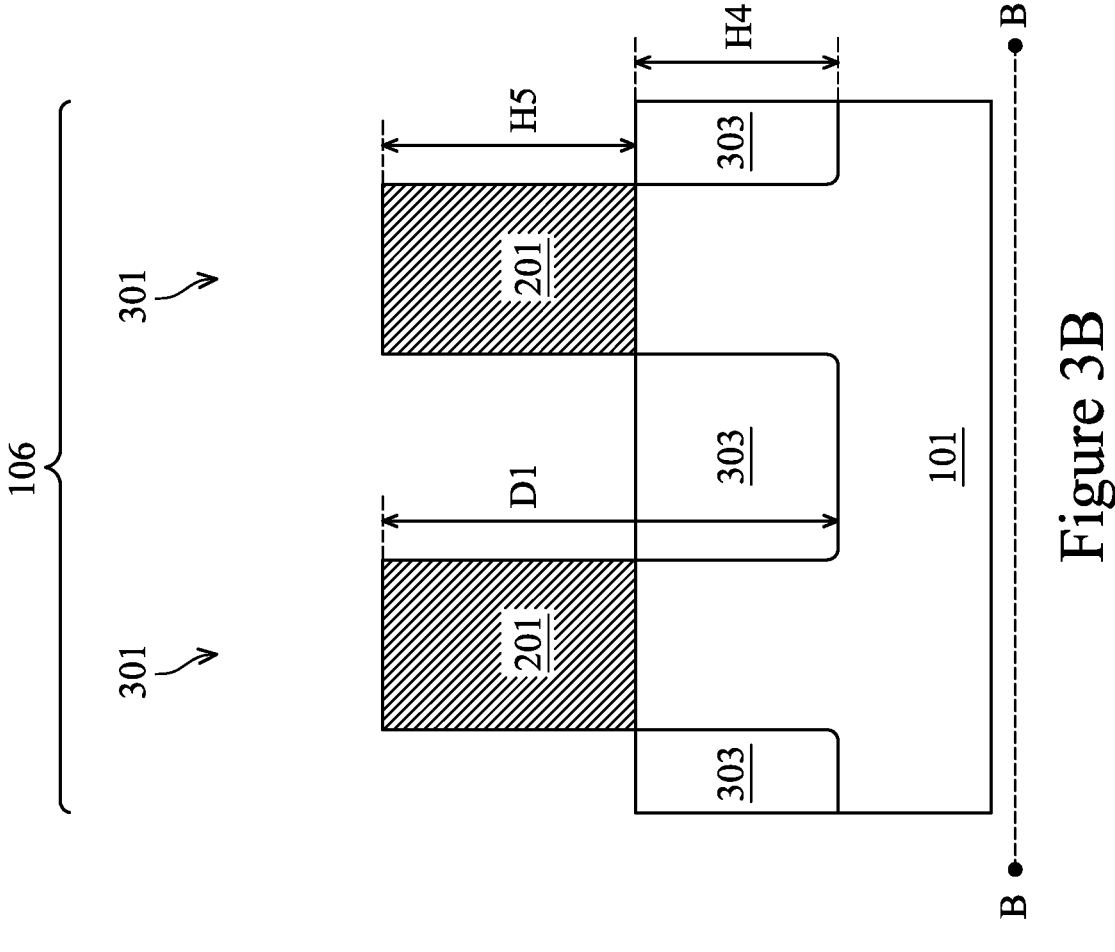

Turning to FIG. 3B, this figure illustrates more details of the formation of the fins 301 and the formation of the isolation regions 303 with regard to the second cutline B-B. In an embodiment the multi-layer stack 103 is formed from semiconductor materials that can work with the substrate 101 to help form nanostructures (e.g., nanosheets, nanowires, or the like) for the Gate All-Around (GAA) devices. The patterning process for forming the fins 301, according to some embodiments, comprises applying a photoresist over the multi-layer stack 103 and then patterning and developing the photoresist to form a mask over the multi-layer stack 103. Once formed, the mask is then used during an etching process, such as an anisotropic etching process to transfer the pattern of the mask into the underlying layers to form trenches in the multi-layer structure 100 and to define the fins 301, wherein the fins 301 are separated by the trenches. The etching process is used to form the trenches to a first depth D1 into the multi-layer structure 100. According to some embodiments, the first depth D1 is between about 20 nm and about 600 nm, such as about 100 nm, although any suitable depth may be used. Although not specifically illustrated in the top-down and cross-sectional views of FIGS. 3A and 3B, the first layers 105, the second layers 107, and portions of the substrate 101 are exposed along sidewalls of the fins 301 as thin strips alternately stacked along the direction of the first depth D1 of the trenches into the multi-layer structure 100.

Additionally, while a single mask process has been described, this is intended to be illustrative and is not intended to be limiting, as the gate all around (GAA) device structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA device structure.

In an embodiment the isolation regions 303 are formed as shallow trench isolation regions by depositing a dielectric material in the trenches. According to some embodiments, the dielectric material used to form the isolation regions 303 may be a material such as an oxide material (e.g., a flowable oxide), high-density plasma (HDP) oxide, or the like. The dielectric material may be formed, after an optional cleaning and lining of the trenches, using either a chemical vapor deposition (CVD) method (e.g., the HARP process), a high density plasma CVD method, or other suitable method of formation to fill or overfill the regions around the fins 301.

According to some embodiments, in which a flowable oxide is utilized as the dielectric material of the isolation regions 303, a post placement anneal process (e.g., oxide densification process) is performed on the multi-layer structure 100 to densify the oxide material of the isolation regions 303 and to reduce its wet etch rate. However, any suitable annealing process may be utilized.

Once densified, excess dielectric material may be removed through a suitable process such as chemical mechanical polishing (CMP), an etch, a combination of these, or the like. In an embodiment, the removal process removes any dielectric material that is located over the fins 301 as well, so that the removal of the dielectric material will expose the surface of the fins 301 to further processing steps.

Once the dielectric material has been deposited to fill or overfill the regions around the fins 301, the dielectric material may then be recessed away from the surface of the fins 301 to form the isolation regions 303. The recessing may be performed to expose at least a portion of the sidewalls of the fins 301 adjacent to the top surface of the fins 301. The dielectric material may be recessed using a wet etch by dipping the top surface of the fins 301 into an etchant selective to the material of the dielectric material, although other methods, such as a reactive ion etch, a dry etch, chemical oxide removal, or dry chemical clean may be used. According to some embodiments, the isolation regions 303 may be formed to a fourth height H4 of between about 10 nm and about 300 nm, such as about 50 nm. However, any suitable height may be used for the fourth height H4.

FIG. 3B further illustrates that the exposed portions of the fins 301 above the isolation regions 303 may be a fifth height H5 above the isolation regions 303. According to some embodiments, the fifth height H5 may be a height of between about 10 nm and about 300 nm, such as about 50 nm. However, any suitable height may be used for the fifth height H5.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form the dielectric material. All of the potential process steps are fully intended to be included within the scope of the present embodiment.

Figure 4A:
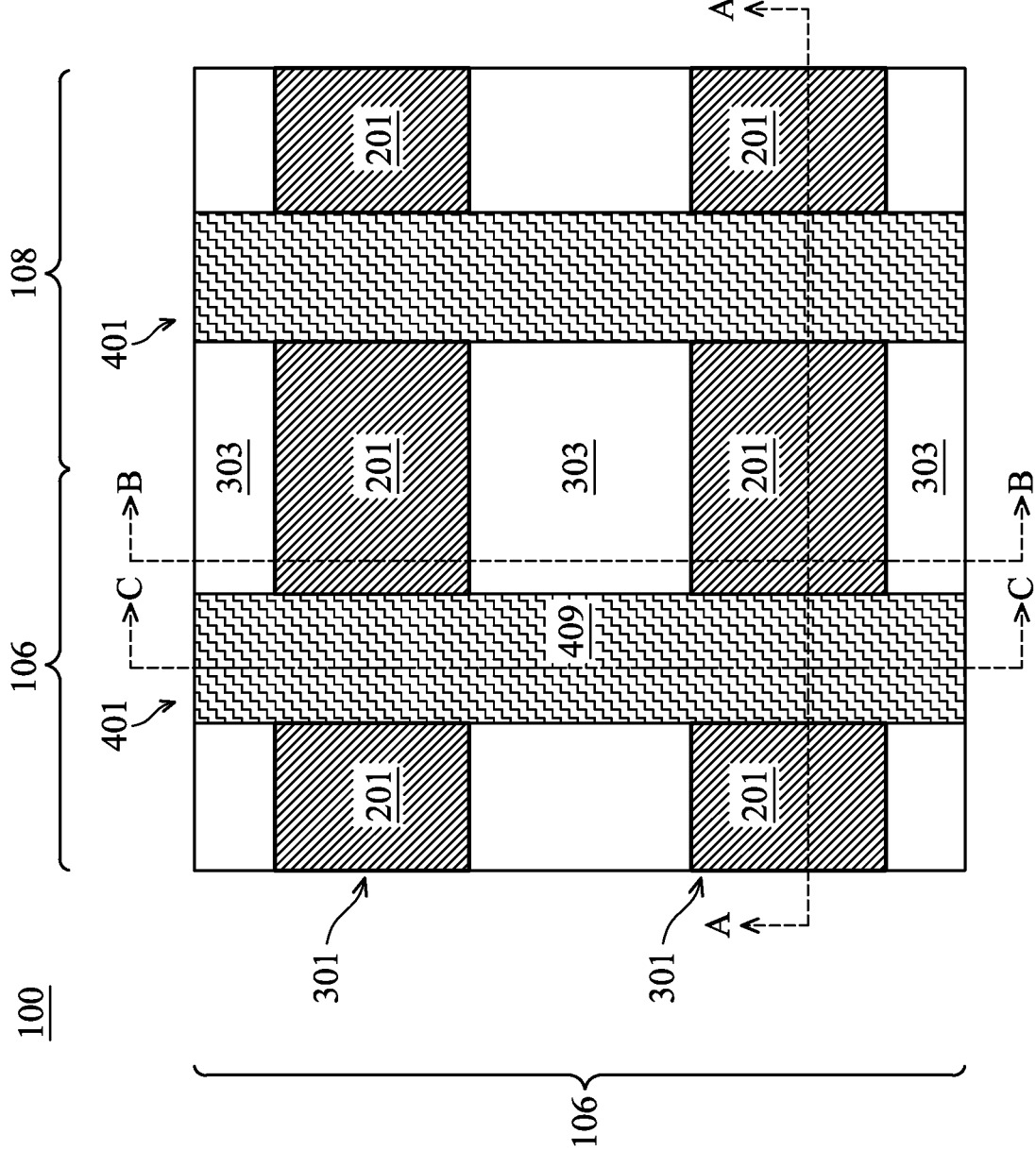
FIGS. 4A-4C illustrate the formation of dummy gate stacks over channel regions of the multi-layer structure, in accordance with some embodiments.

FIG. 4A illustrates, in the top-down view, a formation of dummy gate stacks 401 over the channel regions 305 in the fins 301 in an intermediate stage of manufacturing Gate All-Around (GAA) devices, in accordance with some embodiments. In particular, FIG. 4A further illustrates the first cutline A-A extending through three of the source/drain regions 201 and through two of the dummy gate stacks 401 in a direction of the length of one of the fins 301. The second cutline B-B extends through the two source/drain regions 201, each of the two source/drain regions 201 being located in different ones of the two fins 301 and cutline B-B is located between the dummy gate stacks 401. The third cutline C-C extends through one of the dummy gate stacks 401 and through two of the fins 301. FIG. 4A further illustrates a second hard mask 409 of the dummy gate stacks 401 and will be discussed in greater detail with the following figures.

Figure 4B:
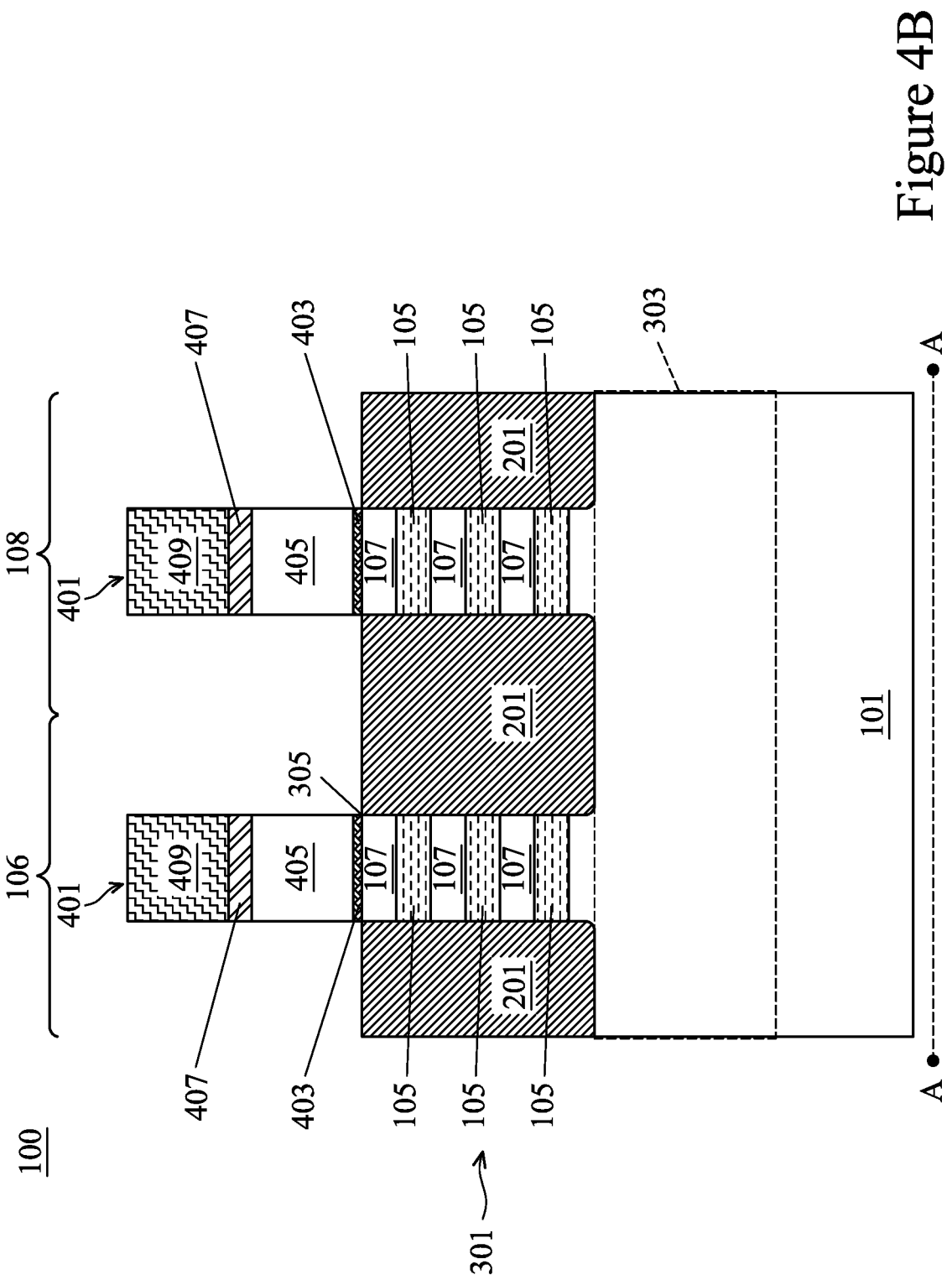

Turning to FIG. 4B, this figure illustrates in greater detail the formation of the dummy gate stacks 401 with regard to the first cutline A-A. In particular, FIG. 4B illustrates two of the dummy gate stacks 401 are formed over the fins 301. Each of the dummy gate stacks 401 are located over the top of a channel region 305 in one of the first device regions 106 and the second device region 108.

According to some embodiments, the dummy gate stacks 401 are formed by initially forming a dummy gate dielectric 403 over the fins 301. In an embodiment the dummy gate dielectric 403 may be formed by thermal oxidation, chemical vapor deposition, sputtering, or any other methods known and used in the art for forming a gate dielectric.

Depending on the technique of gate dielectric formation, the dummy gate dielectric 403 thickness on the top may be different from the dummy dielectric thickness on the sidewall. In some embodiments, the dummy gate dielectric 403 may be formed by depositing a material such as silicon and then oxidizing or nitridizing the silicon layer in order to form a dielectric such as the silicon dioxide or silicon oxynitride. In such embodiments, the dummy gate dielectric 403 may be formed to a thickness ranging from between about 3 Å and about 100 Å, such as about 10 Å. In other embodiments, the dummy gate dielectric 403 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used for the dummy gate dielectric 403.

Once the dummy gate dielectric 403 has been formed, the dummy gate electrode 405 may comprise a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 405 may be deposited by chemical vapor deposition (CVD), sputter deposition, or other techniques known and used in the art for depositing conductive materials. The thickness of the dummy gate electrode 405 may be in the range of about 5 Å to about 500 Å. The top surface of the dummy gate electrode 405 may have a non-planar top surface, and may be planarized prior to patterning of the dummy gate electrode 405 or gate etch. Ions may or may not be introduced into the dummy gate electrode 405 at this point. Ions may be introduced, for example, by ion implantation techniques.

Once the dummy gate electrode 405 has been formed, the dummy gate dielectric 403 and the dummy gate electrode 405 may be patterned. In an embodiment the patterning may be performed by initially forming a first hard mask 407 over the dummy gate electrode 405 and forming the second hard mask 409 over the first hard mask 407.

According to some embodiments, the first hard mask 407 comprises a dielectric material such as silicon oxide, silicon nitride, titanium nitride, silicon oxynitride, combinations of these, or the like. The first hard mask 407 may be formed using a process such as chemical vapor deposition, plasma enhanced chemical vapor deposition, atomic layer deposition, or the like. However, any other suitable material and method of formation may be utilized. The first hard mask 407 may be formed to a thickness of between about 20 Å and about 3000 Å, such as about 20 Å.

According to some embodiments, the second hard mask 409 comprises a separate dielectric material such as silicon nitride, silicon oxide, titanium nitride, silicon oxynitride, combinations of these, or the like. The second hard mask 409 may be formed using a process such as chemical vapor deposition, plasma enhanced chemical vapor deposition, atomic layer deposition, or the like. However, any other suitable material and method of formation may be utilized. The second hard mask 409 may be formed to a thickness of between about 20 Å and about 3000 Å, such as about 20 Å.

Figure 4C:
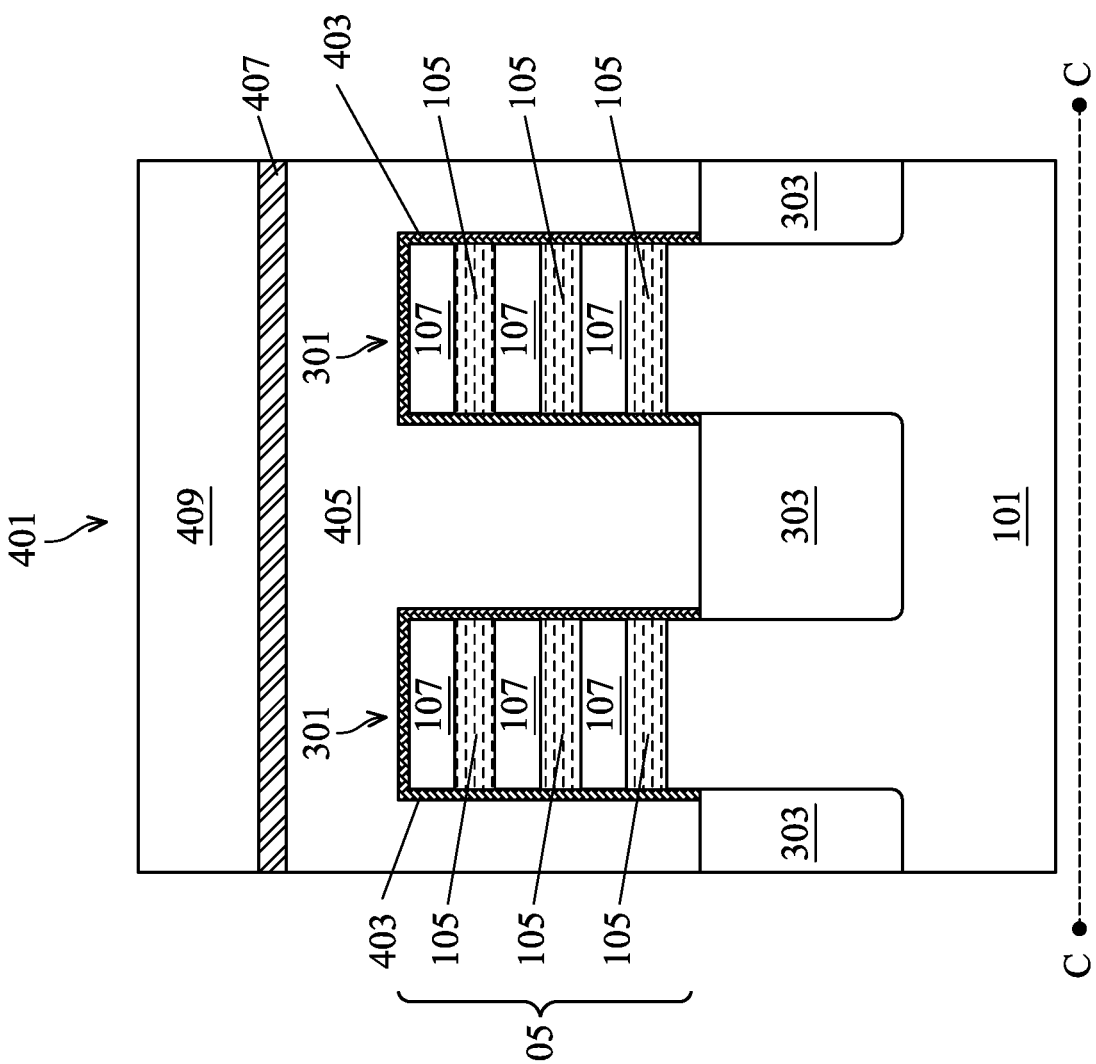

FIG. 4C illustrates more details of the formation of the dummy gate stacks 401 with regard to the third cutline C-C. In particular, FIG. 4C illustrates one of the dummy gate stacks 401 formed over two of the fins 301. The dummy gate dielectric 403 is formed along the sidewalls of the fins 301 and over the tops of the fins 301. The dummy gate electrode

405 is formed over the fins 301 and surrounds the dummy gate dielectric 403. The first hard mask 407 and the second hard mask 409 are disposed over the dummy gate electrode 405.

Figure 5A:
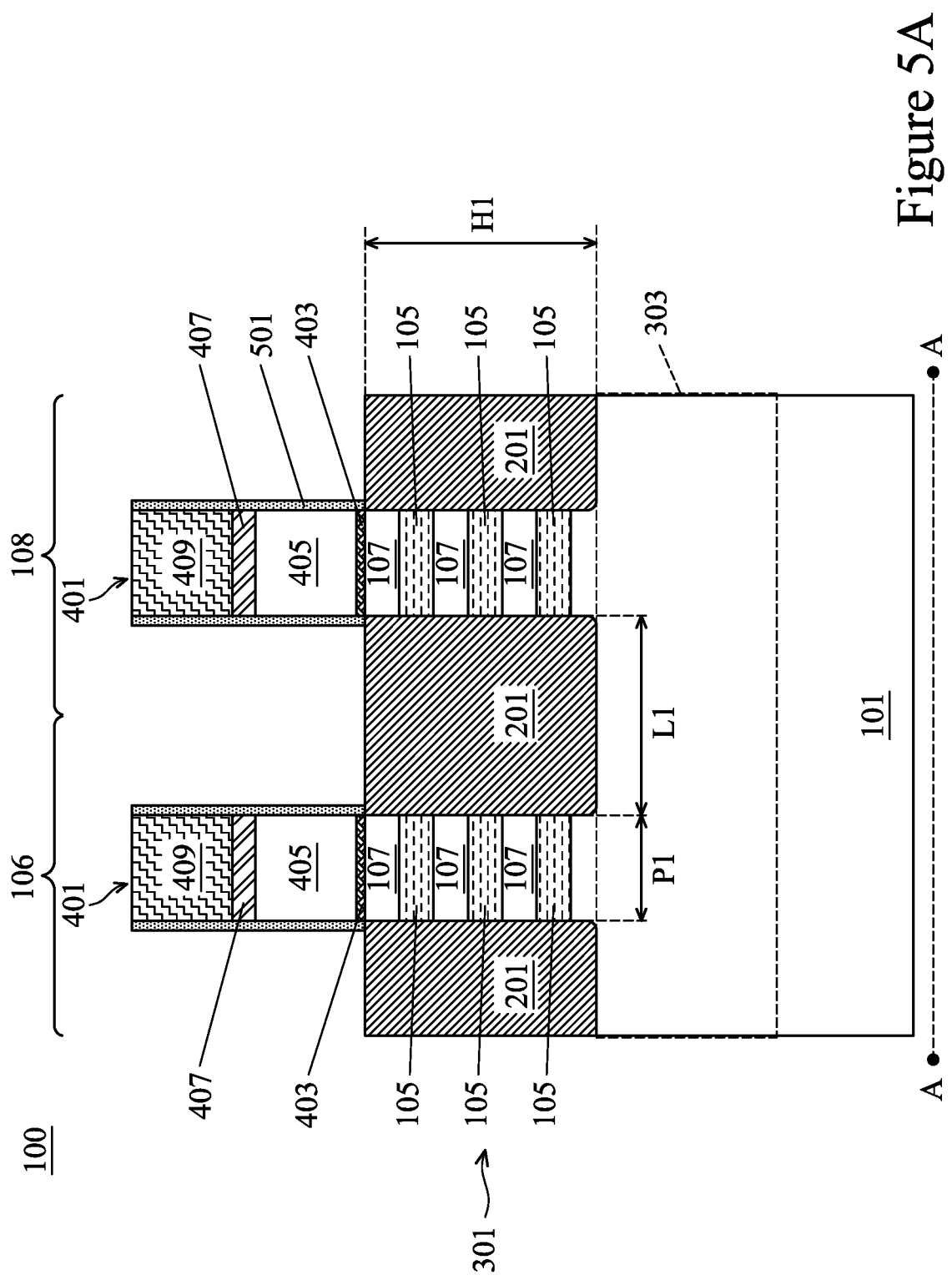
Figure 5B:
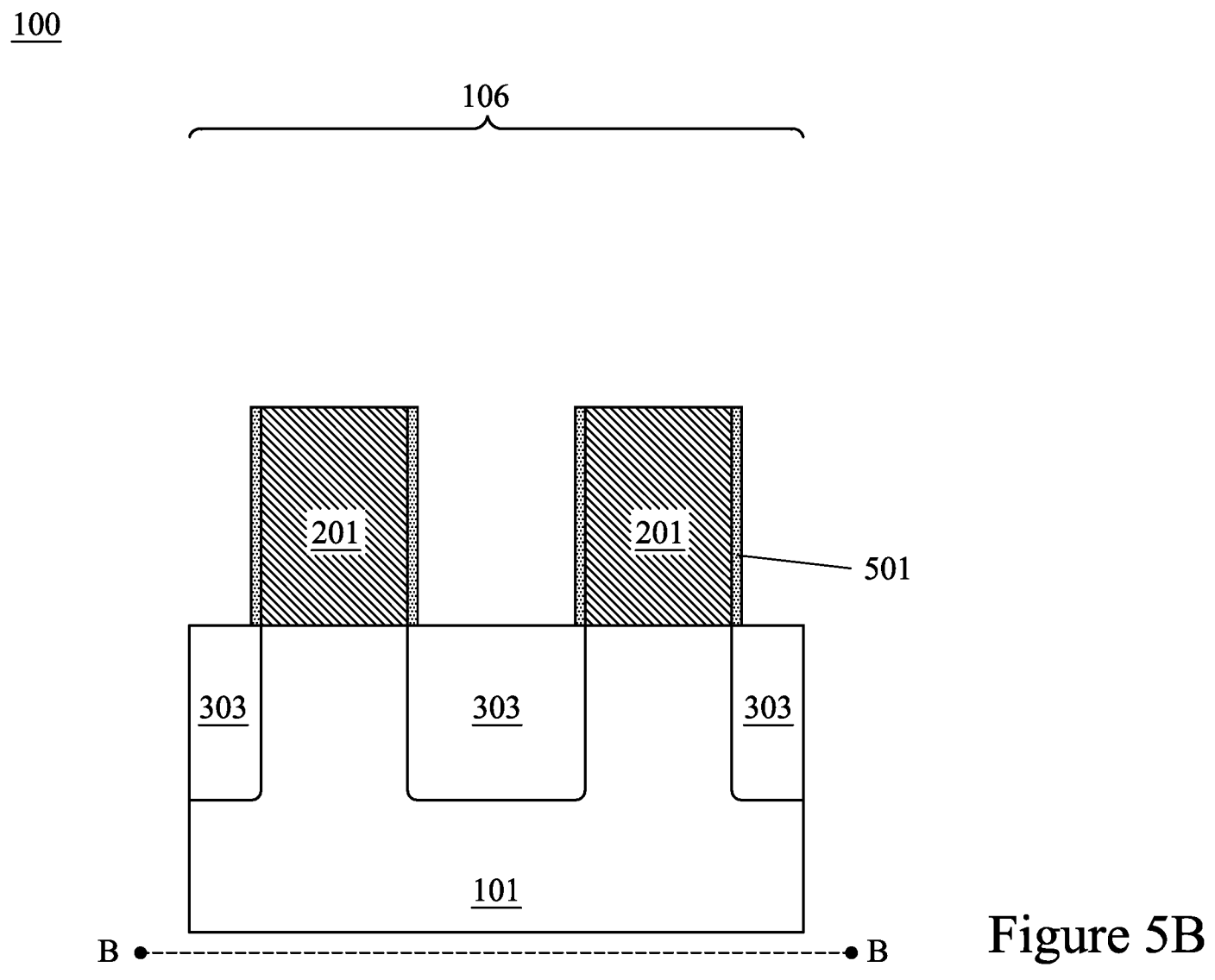

Continuing to FIGS. 5A and 5B, these figures illustrates a formation of a first spacer layer 501 (e.g., of a top gate spacer) with regard to the first cutline A-A and the second cutline B-B, respectively. According to an embodiment, the first spacer layer 501 is formed by blanket deposition on the multi-layer structure 100. As such, the first spacer layer 501 is deposited over the top surfaces and sidewalls of the dummy gate stacks 401, the top surfaces and sidewalls of the source/drain regions 201 and top surfaces of the isolation regions 303. According to some embodiments, the first spacer layer 501 may comprise a dielectric material such as silicon oxide ($SiO_2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, combination thereof, or the like may be utilized. The first spacer layer 501 may be formed by methods utilized to form such a layer, such as chemical vapor deposition (CVD), plasma enhanced CVD, sputter, thermal oxidation, and any other suitable methods.

Once the first spacer layer 501 has been formed, an optional second spacer layer (not separately illustrated) may be formed by blanket deposition over the first spacer layer 501. The optional second spacer layer may be formed using any of the materials and methods suitable for forming the first spacer layer 501.

Once formed, the first spacer layer 501 and (if formed) the optional second spacer layer may be etched in order to shape these spacer layers on the dummy gate stacks 401 and source/drain regions 201. In an embodiment the first spacer layer 501 and the optional second spacer layer may be recessed using an anisotropic etching process (e.g., a dry etching process) such as a reactive ion etching (RIE) process, an isotropic etching process (e.g., a wet etching process), combination thereof, or the like. During the etching process, an initial etching step may be performed to remove the materials of the first spacer layer 501 and (if formed) the optional second spacer layer from all of the horizontal surfaces of the multi-layer structure 100. As such, the tops of the dummy gate stacks 401, the tops of the source/drain regions 201, and the tops of the isolation regions 303 are exposed.

If desired, in some embodiments further etching steps may also be performed to recess remaining portions of first spacer layer 501 and the optional second spacer layer. According to some embodiments, the remaining portions of the optional second spacer layer may be recessed along the vertical sidewalls of the dummy gate stacks 401 such that only the first spacer layer 501 remains along the sidewalls of the dummy gate stacks 401. According to some embodiments, remaining portions of the first spacer layer 501 and remaining portions of the optional second spacer layer may be recessed along the vertical sidewalls of the source/drain regions 201 such that a top section of the vertical sidewalls of the source/drain regions 201 are exposed and a bottom section of the vertical sidewalls of the source/drain regions 201 remain covered by the first spacer layer 501 and the optional second spacer layer.

However, while embodiments are described using one or two dielectric spacer layers, this is intended to be illustrative and is not intended to be limiting. Rather, any number of spacer layers and any combinations of deposition and removal processes may be used, and all such processes are fully intended to be included within the scope of the embodiments.

Figure 6A:
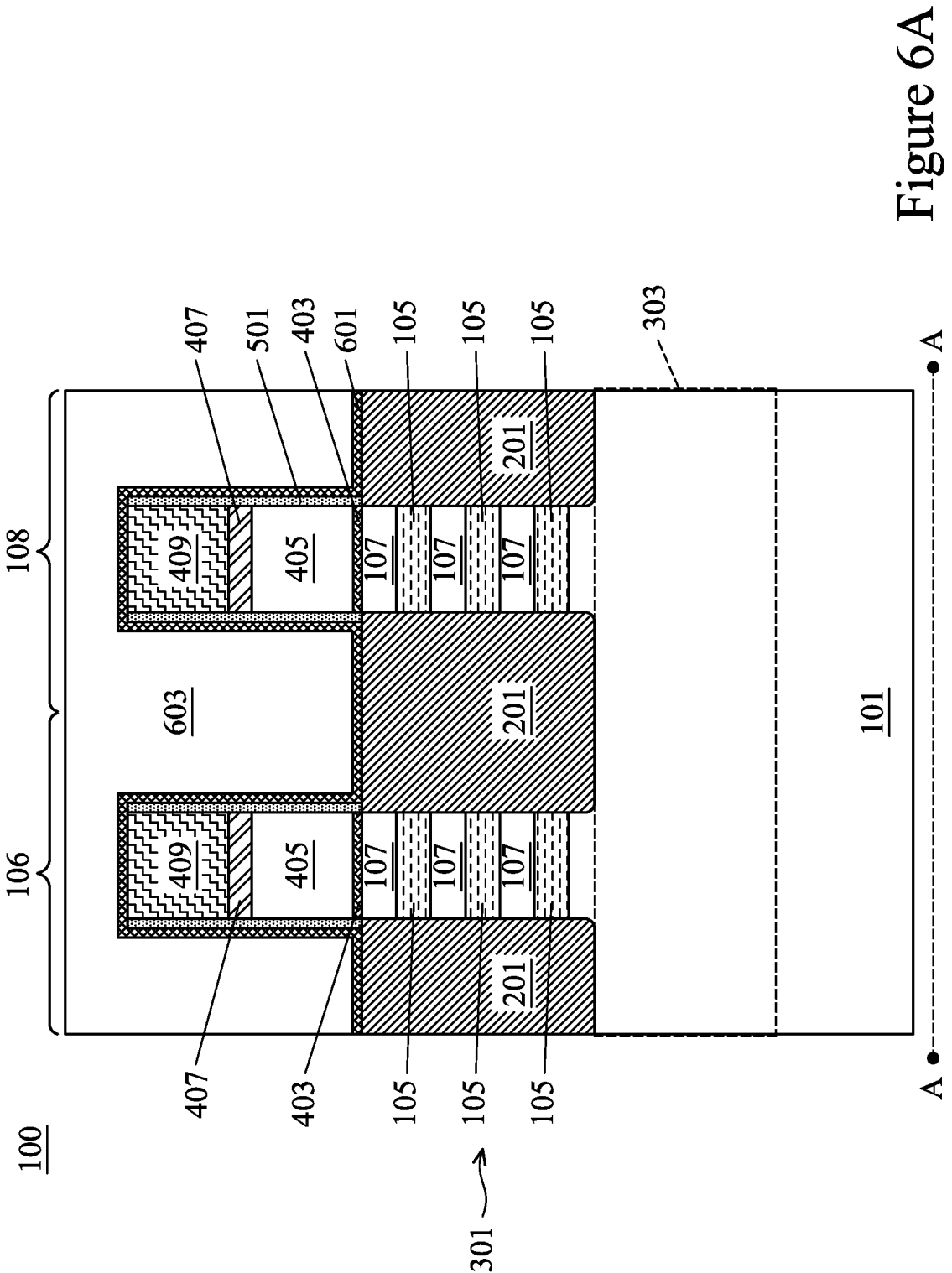
FIGS. 6A-6C illustrate the formation of a contact etch stop layer and a first interlayer dielectric over the multi-layer structure, in accordance with some embodiments.

Turning to FIG. 6A, this figure illustrates the formation of a contact etch stop layer 601 (CESL) and a first interlayer dielectric 603 (ILD) with regard to the first cutline A-A. In some embodiments, the contact etch stop layer 601 is formed by a blanket deposition of a dielectric layer over the exposed surfaces of the second hard mask 409, the first spacer layer 501, and the source/drain regions 201. The contact etch stop layer 601 comprises a dielectric material, such as, silicon nitride, silicon oxide, silicon oxynitride, or the like, having a different etch rate than that of the first interlayer dielectric 603.

Once the contact etch stop layer 601 has been formed, the first interlayer dielectric 603 may be formed as a bulk material layer over the contact etch stop layer 601. According to some embodiment, the first interlayer dielectric 603 comprises a dielectric material, and is deposited using a suitable method, such as CVD, plasma-enhanced CVD (PECVD), or flowable chemical vapor deposition (FCVD), although other processes, such as low pressure chemical vapor deposition (LPCVD), may also be used. The first interlayer dielectric 603 may be deposited using a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used.

Figure 6B:
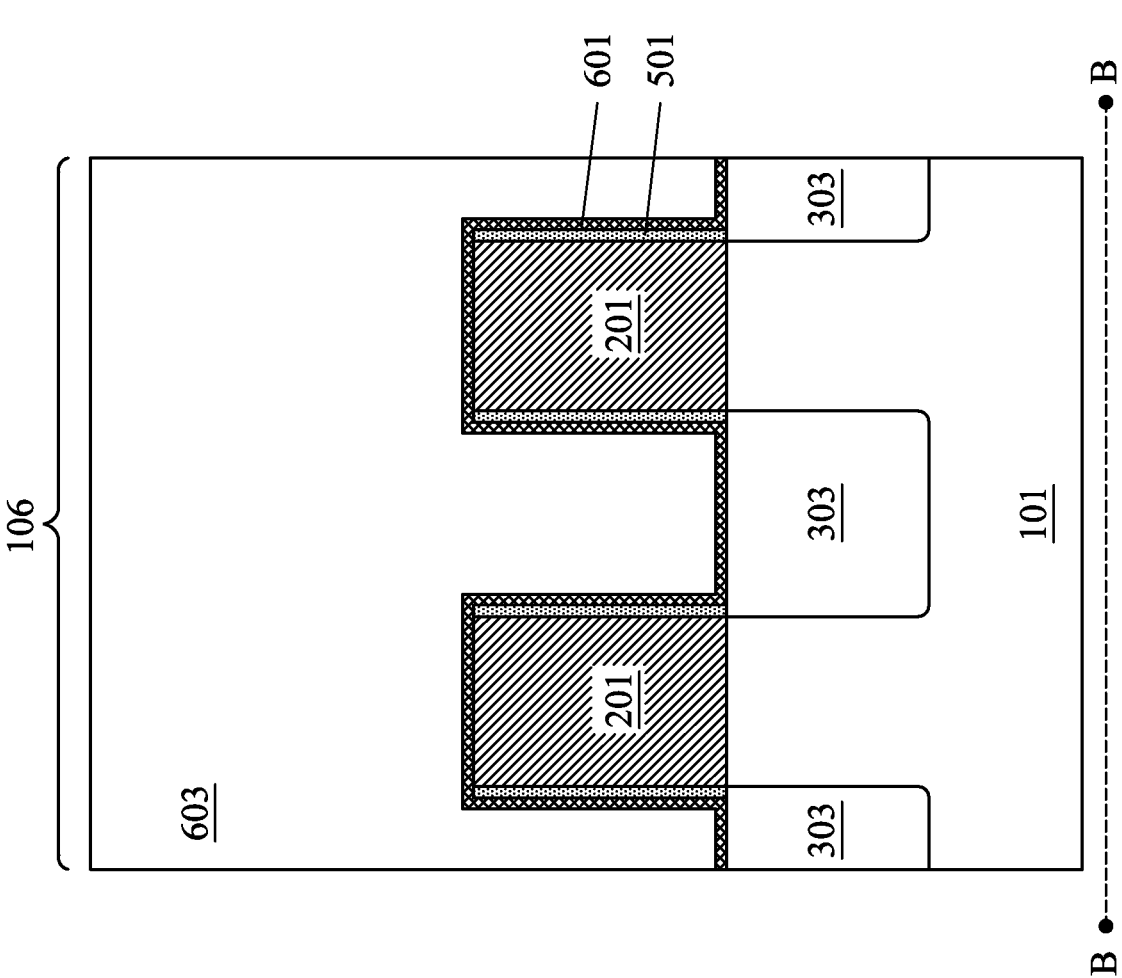

FIG. 6B illustrates the deposition of the contact etch stop layer 601 and the first interlayer dielectric 603 in the first device region 106 with regard to the second cutline B-B. In particular, FIG. 6B illustrates the contact etch stop layer 601 being deposited over the exposed surfaces of the source/drain regions 201, the first spacer layer 501 and the isolation regions 303. The first interlayer dielectric 603 is deposited over the contoured surfaces of the contact etch stop layer 601.

Figure 6C:
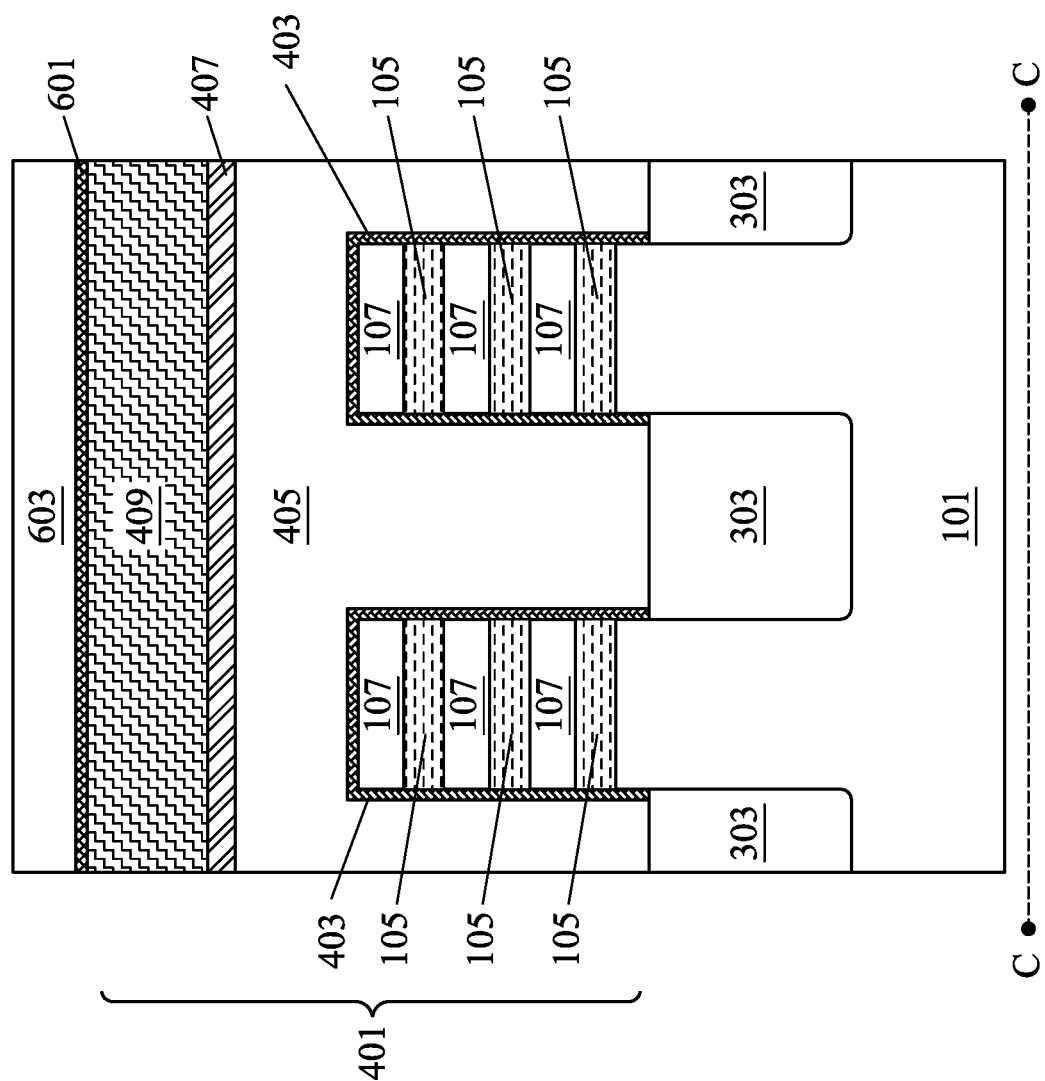

FIG. 6C illustrates the deposition of the contact etch stop layer 601 and the first interlayer dielectric 603 with regard to the third cutline C-C. According to some embodiments, the contact etch stop layer 601 and the overlying layer of the first interlayer dielectric 603 are disposed over the top of the second hard mask 409.

Figure 7A:
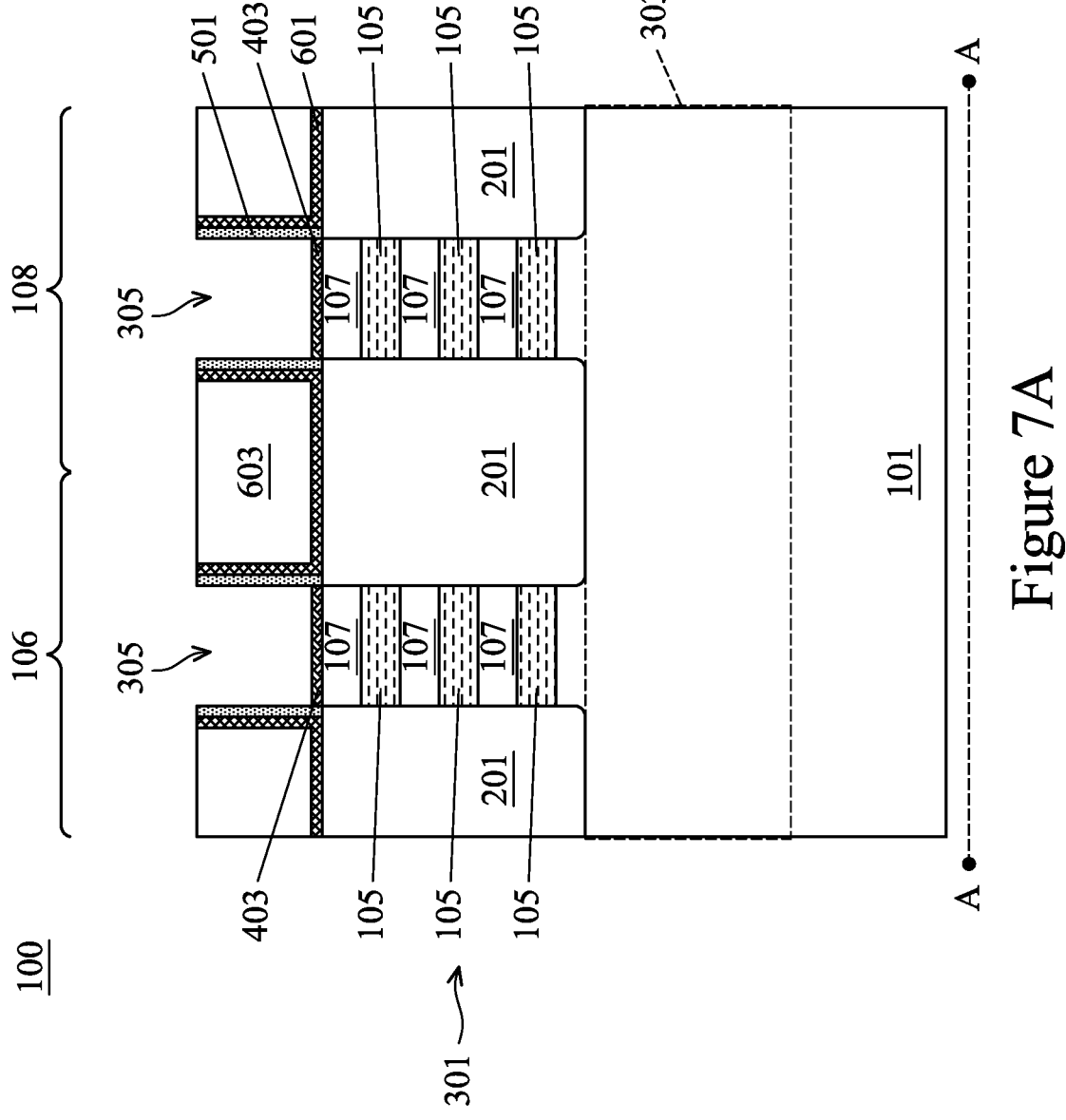
FIGS. 7A and 7B illustrate the removal of the dummy gate stacks from over the multi-layer structure, in accordance with some embodiments.

Continuing to FIG. 7A, this figure illustrates a planarization process, once the first interlayer dielectric 603 has been deposited. According to some embodiments, the first interlayer dielectric 603 may be planarized with the first spacer layer 501 using, e.g., a planarization process such as a chemical mechanical polishing process, although any suitable process may be utilized. Additionally, the planarization process can also remove the second hard mask 409 while stopping on the first hard mask 407. Once the planarization process has been completed, the first hard mask 407 as well as the dummy gate electrode 405 can be removed to expose the dummy gate dielectric 403. In an embodiment the first hard mask 407 may be removed using an etching process or a planarization process (e.g., a continuation of the previous chemical mechanical polishing process) to remove the material of the first hard mask 407. However, any suitable method of removing the first hard mask 407 to expose the material of the dummy gate electrode 405 may be utilized.

Once the dummy gate electrode 405 has been exposed, the dummy gate electrode 405 may be removed in order to expose the dummy gate dielectric 403 in the first device region 106 and/or the second device region 108. In an embodiment the dummy gate electrode 405 may be removed using, e.g., one or more wet or dry etching process that utilizes etchants that are selective to the material of the dummy gate electrode 405. However, any suitable removal process may be utilized.

Figure 7B:
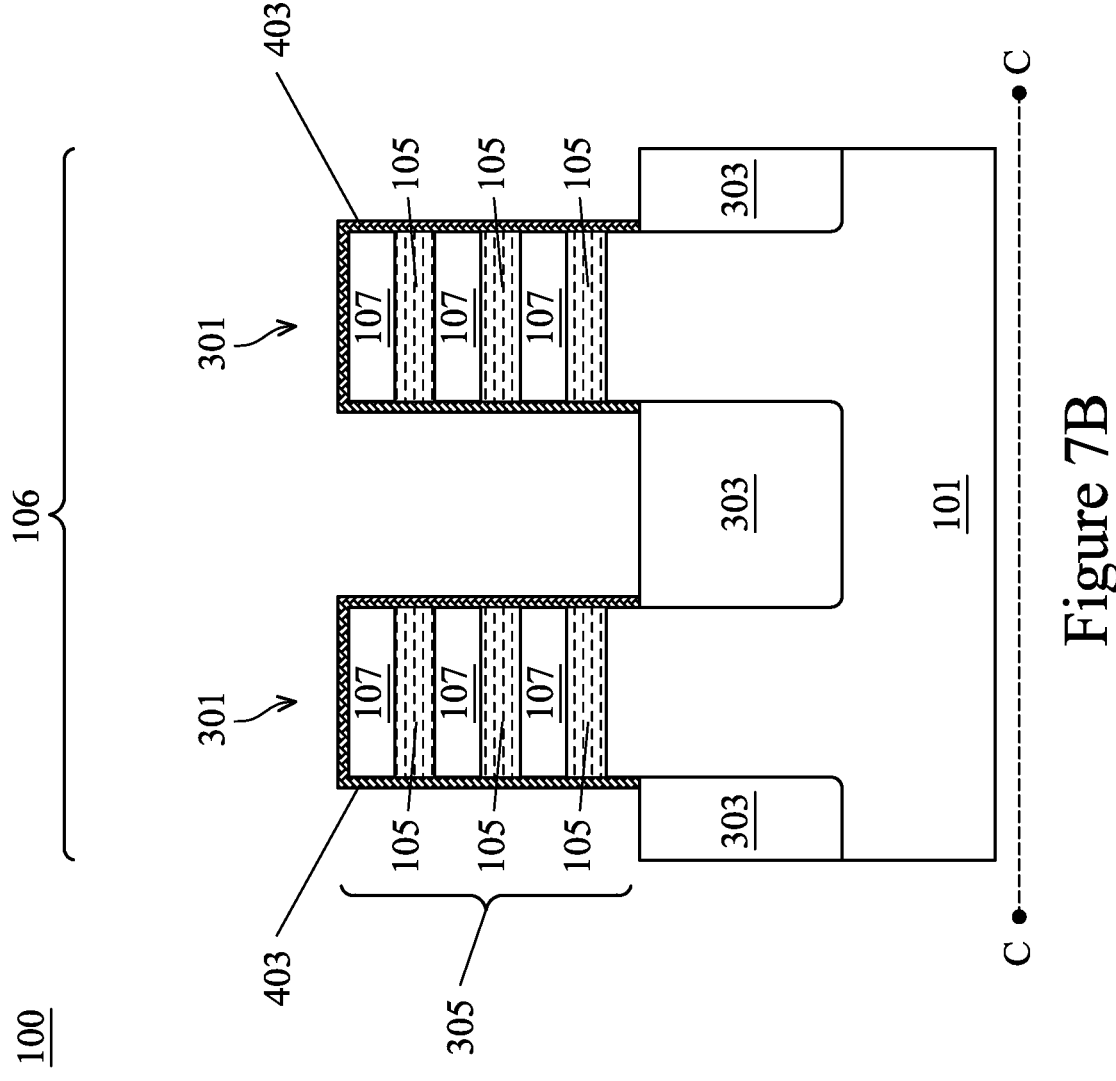

FIG. 7B illustrates the planarization process and the removal of the first hard mask 407 and the dummy gate electrode 405 over the channel regions 305 with regard to the third cutline C-C. In particular, the first interlayer dielectric 603, the contact etch stop layer 601, the second hard mask 409, the first hard mask 407 and the dummy gate electrode 405 are removed during the planarization process or the etching process, as described above. As such, the dummy gate dielectric 403 is exposed in the channel regions 305 of the first device region 106.

Figure 8A:
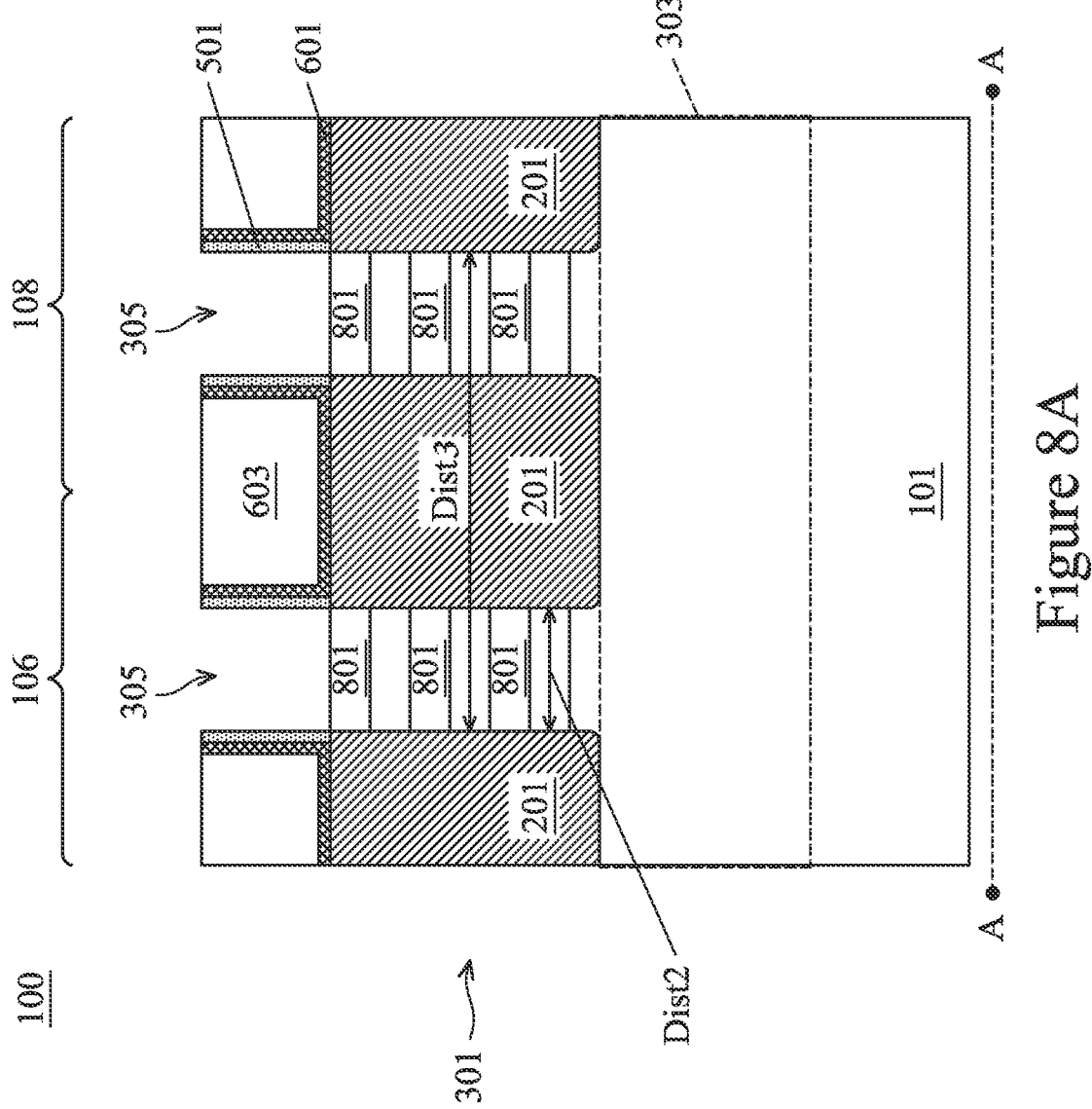
FIGS. 8A and 8B illustrate a wire-release process performed on the multi-layer structure, in accordance with some embodiments.
Figure 8B:
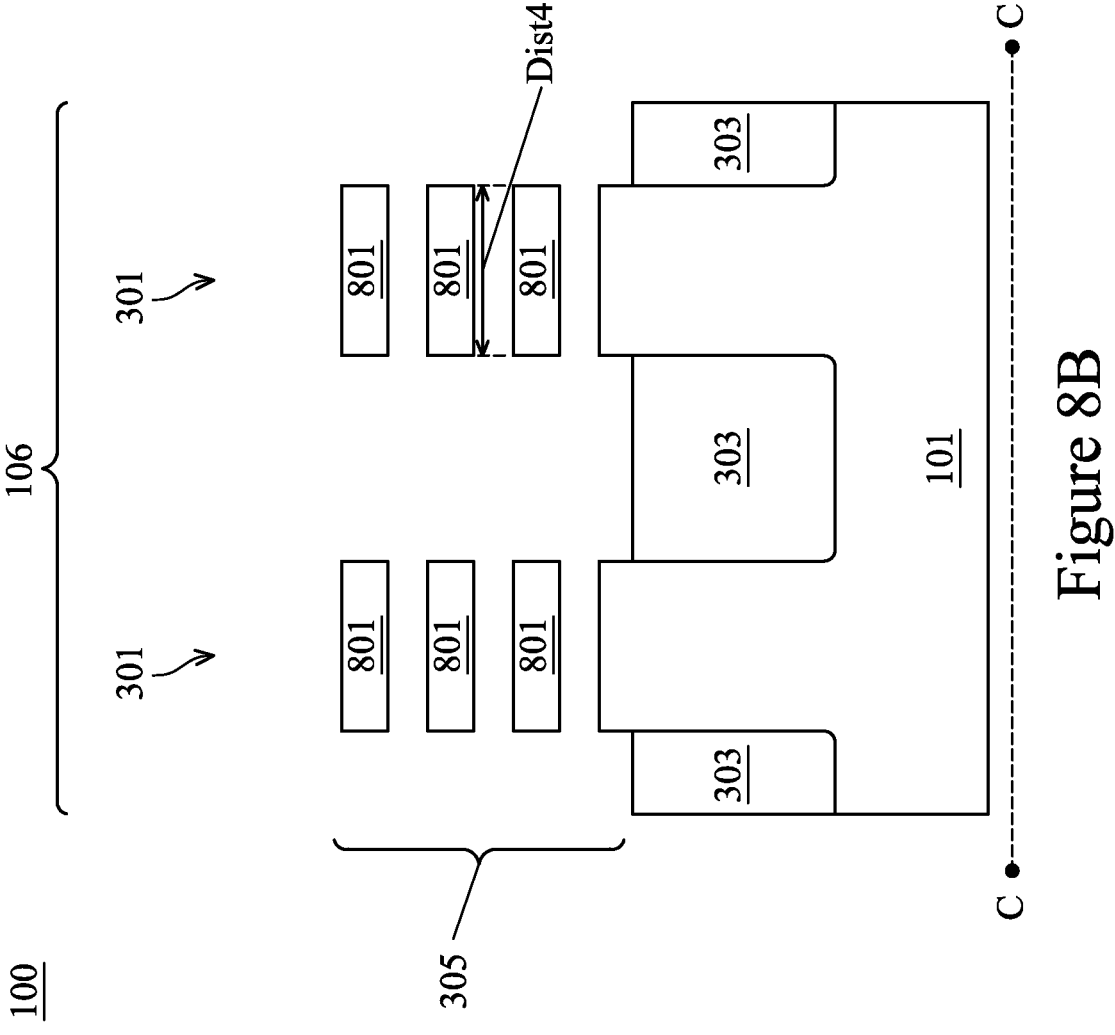

FIGS. 8A and 8B illustrate a removal of the dummy gate dielectric 403 and a wire release process in the channel regions 305, according to some embodiments. In particular, FIG. 8A illustrates the wire release process in the first device region 106 and the second device region 108 with regard to the first cutline A-A and FIG. 8B illustrates the wire release process in the first device region 106 with regard to the third cutline C-C. The wire release process step may also be referred to as a sheet release process step, a sheet formation process step, a nanosheet formation process step or a wire formation process step.

Once the dummy gate dielectric 403 has been exposed, the dummy gate dielectric 403 within the first device region 106 and the second device region 108 may be removed. In an embodiment the dummy gate dielectric 403 may be removed using, e.g., a wet etching process, although any suitable etching process may be utilized.

FIGS. 8A and 8B further show that, once the dummy gate dielectric 403 has been removed (which also exposes the sides of the first layers 105), the first layers 105 may be removed from between the substrate 101 and from between the second layers 107 within the first device region 106 and/or the second device region 108. In an embodiment the first layers 105 may be removed using a wet etching process that selectively removes the material of the first layers 105 (e.g., silicon germanium (SiGe)) without significantly removing the material of the substrate 101 and the material of the second layers 107 (e.g., silicon (Si)). However, any suitable removal process may be utilized. In an embodiment, an etchant such as a high temperature HCl may be used. Additionally, the wet etching process may be performed at a temperature of between about 400° C. and about 600° C., such as about 560° C., and for a time of between about 100 seconds and about 600 seconds, such as about 300 seconds. However, any suitable etchant, process parameters, and time can be utilized.

By removing the material of the first layers 105, the material of the second layers 107 (relabeled nanostructures 801 in FIG. 8A) are formed into stacks of nanostructures 801 within the first device region 106 and/or the second device region 108, spaced apart from one another. The stacks of the nanostructures 801 comprise the channel regions 305 that stretch between opposite ones of the source/drain regions 201 within the first device region 106 and/or the second device region 108. In an embodiment, the nanostructures 801 are formed to have same or thinner thicknesses as the original thicknesses of the second layers 107.

FIG. 8A further illustrates that the nanostructures 801 span a second distance Dist2 along the first cutline A-A between adjacent ones of the source/drain regions 201 within the fin 301. The second distance Dist2 of the nanostructures 801 may be representative of a channel length of the channels in the channel regions 305. According to some embodiments, the second distance Dist2 is a distance of between about 5 nm and about 100 nm, such as about 10 nm. However, any suitable distance may be used. In addition, the nanostructures 801 of the first device region 106 and the second device region 108 may span across a third distance Dist3 between interfaces with the outermost ones of the source/drain regions 201 along the first cutline A-A of the fin 301. According to some embodiments, the third distance Dist3 is a distance between about 10 nm and about 300 nm, such as about 30 nm. However any suitable distance may be used. The source/drain regions 201 also support the nanostructures 801 and help to prevent nanosheet crashes during the wire release process step.

Additionally, although FIG. 8A illustrates the formation of three of the nanostructures 801 in the stack, any suitable number of nanostructures 801 may be formed from the second layers 107 provided in the multi-layer stack 103. For example, the multi-layer stack 103 may be formed to include any suitable number of the first layers 105 and any suitable number of the second layers 107. As such, a multi-layer stack 103 comprising fewer of the first layers 105 and fewer of the second layers 107, after removal of the first layers 105, forms one or two of the nanostructures 801 in the stack. Whereas, a multi-layer stack 103 comprising many of the first layers 105 and many of the second layers 107, after removal of the first layers 105, forms four or more of the nanostructures 801 in the stack.

FIG. 8B illustrates a cross-sectional view of the first device region 106 along the third cutline C-C. As can be seen, with the removal of the dummy gate dielectric 403, the sides of the second layers 107 (relabeled in FIG. 8B to the nanostructures 801) are exposed. As such, the first layers 105 (as seen in FIG. 7A) may be exposed to the etchant and removed from between the substrate 101 and the second layers 107 in order to form the nanostructures 801 in the first device region 106 and/or the second device region 108. FIG. 8B further illustrates a fourth distance Dist4 of the nanostructures 801. The fourth distance Dist4 may be representative of a channel width of the channels in the channel regions 305. According to some embodiments, the fourth distance Dist4 is a distance of between about 5 nm and about 100 nm, such as about 10 nm. However, any suitable distance may be used.

Figure 9A:
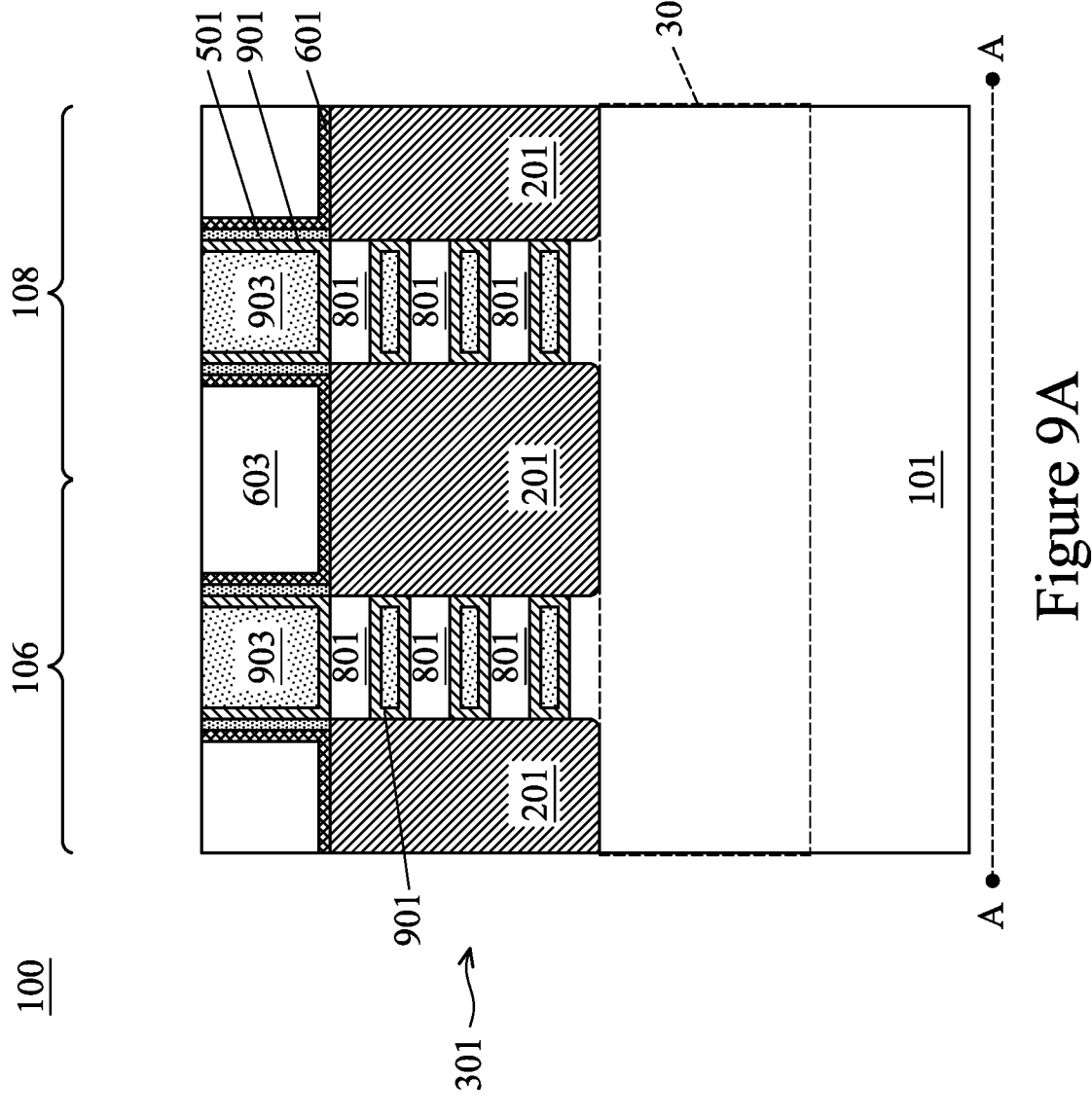
FIGS. 9A and 9B illustrate the formation of a gate dielectric and a gate contact over channel regions of the multi-layer structure, in accordance with some embodiments.
Figure 9B:
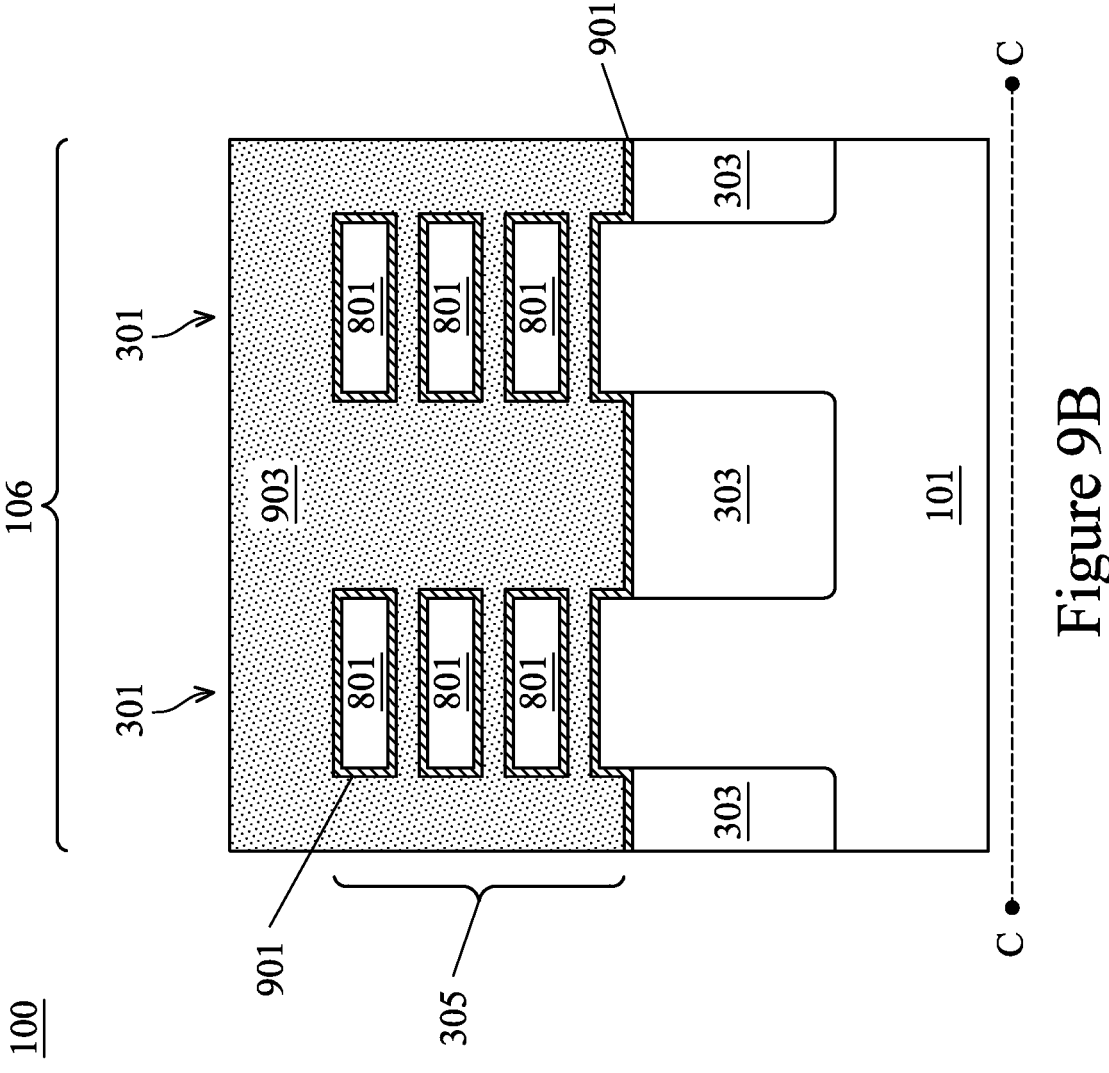

FIGS. 9A and 9B illustrate a formation of a gate dielectric 901 and a gate contact 903, according to some embodiments. In particular, FIG. 9A illustrates these formations with regard to the first cutline A-A through the channel regions 305 of the first device region 106 and the second device region 108 and FIG. 9B illustrates these formations with regard to the third cutline C-C through the channel regions 305 of the first device region 106.

Once the nanostructures 801 have been exposed, the gate dielectric 901 may be formed around the nanostructures 801, in accordance with some embodiments. In some embodiments, an optional first interface layer (not separately illustrated) may be formed around the nanostructures 801, prior to the formation of the gate dielectric 901. In some embodiments, the first interface layer comprises a buffer material such as silicon oxide, although any suitable material may be utilized. The first interface layer may be formed around the nanostructures 801 using a process such as CVD, PVD, or even oxidation to a thickness of between about 1 Å and about 20 Å, such as about 9 Å. However, any suitable process or thicknesses may be utilized. Furthermore, the width of the gate dielectric 901 between the source/drain regions 201 may be equal to the second distance Dist2, according to some embodiments. According to some embodiments, the interface between the gate dielectric 901 and the nanostructure 801 may be equal to the channel length of the channel region 305.

In an embodiment the gate dielectric 901 comprises a high-k material (e.g., K>=9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTiO, HfZrO, LaO, ZrO, TiO), combinations of these, or the like, deposited through a process such as atomic layer deposition, chemical vapor deposition, or the like. In some embodiments, the gate dielectric 901 comprises a nitrogen doped oxide dielectric that is initially formed prior to forming a metal content high-K (e.g., K value>13) dielectric material. The gate dielectric 901 may be deposited to a thickness of between about 1 nm and about 3 nm, although any suitable material and thickness may be utilized. As illustrated in FIGS. 9A and 9B, the gate dielectric 901 wraps around and isolates the nanostructures 801, thus forming a stack of channels within the fins 301 of the first device region 106 and the second device region 108.

Additionally, in some embodiments the first interface layer and/or the gate dielectric 901 make physical contact with the source/drain regions 201. In particular, the first interface layer and/or the gate dielectric 901 are formed without the need for forming additional spacers between the nanostructures 801. Without such spacers, the overall process can be simplified and made more efficient. Each nanostructure 801 within the stack extends between the adjacent source/drain regions 201, and the gate dielectric 901 is in direct physical contact with the adjacent source/drain regions 201 as shown in FIG. 9A. Each gate dielectric 901 surrounds each of the nanostructures 801 within the stack as shown in FIG. 9B.

FIGS. 9A and 9B further illustrate that the gate contact 903 is formed to surround the nanostructures 801 within the first device region 106 and/or the second device region 108. In an embodiment the gate contact 903 is formed using multiple layers, each layer deposited sequentially adjacent to each other using a highly conformal deposition process such as atomic layer deposition, although any suitable deposition process may be utilized. According to some embodiments, the gate contact 903 may comprise a capping layer, a barrier layer, an n-metal work function layer, a p-metal work function layer, and a fill material. Furthermore, the gate contact 903 is over and surrounds the gate dielectric 901 that surrounds each of the nanostructures 801 as shown in FIG. 9B.

The capping layer may be formed adjacent to the gate dielectric 901 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, TaSi$_2$, NiSi$_2$, Mn, Zr, ZrSi$_2$, TaN, Ru, AlCu, Mo, MoSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

According to some embodiments, one or more of the layers within the gate contact 903 in the first device region 106 and the second device region 108 may be formed during a same series of steps. For example, the capping layers and the barrier layers in both of the gate contact 903 may be formed simultaneously, while other layers such as the n-metal work function layer and the p-metal work function layer may be formed and/or patterned independently of each other. Any suitable combination of depositions and removals may be utilized to form the gate contacts 903 in the first device region 106 and the second device region 108.

Once the openings left behind by the removal of the dummy gate electrode 405 have been filled, the materials of the gate contacts 903 in the first device region 106 and the second device region 108 may be planarized in order to remove any material that is outside of the openings left behind by the removal of the dummy gate electrode 405. In a particular embodiment the removal may be performed using a planarization process such as chemical mechanical polishing. However, any suitable planarization and removal process may be utilized.

Figure 10A:
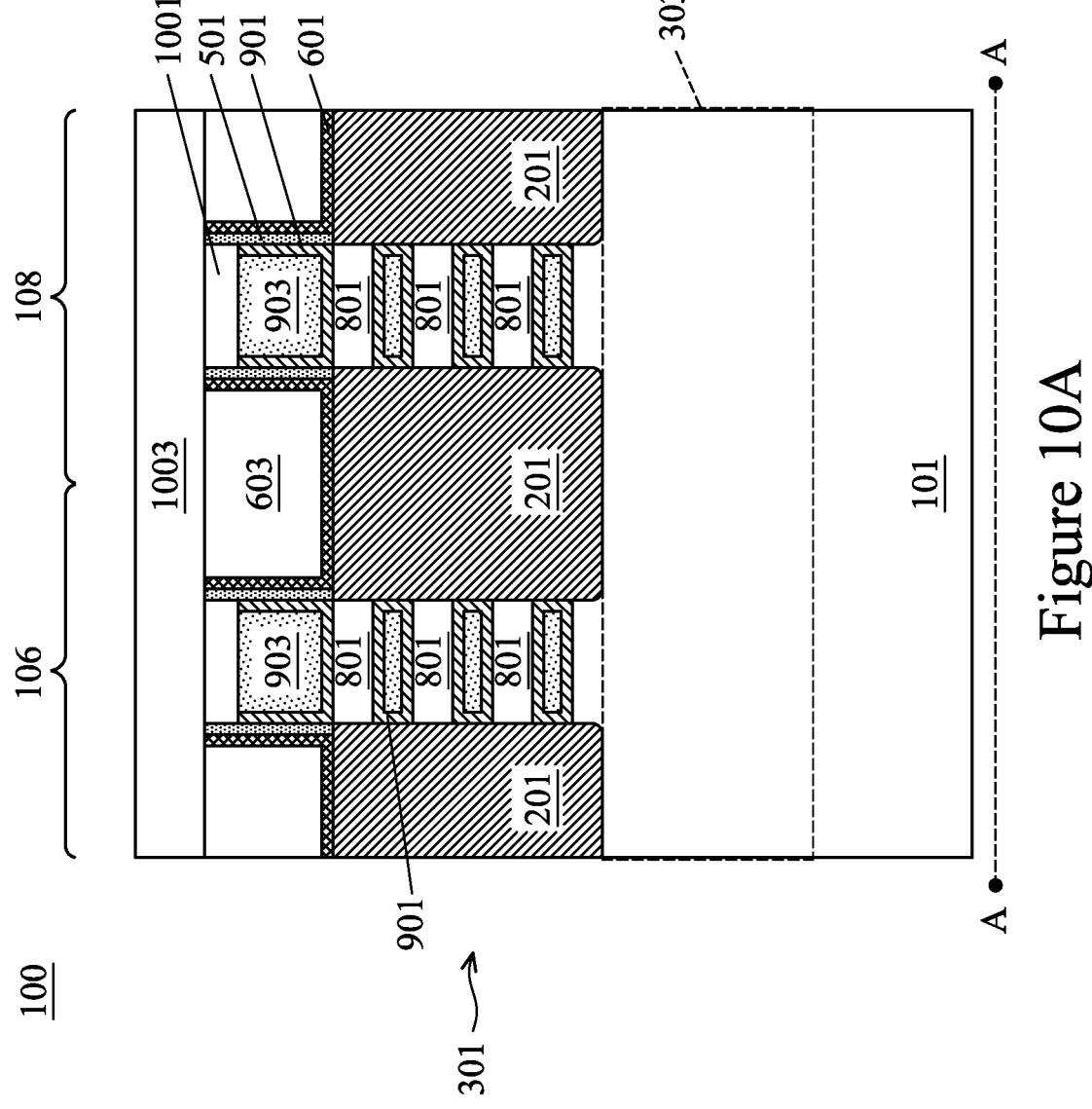
FIGS. 10A to 12B illustrate steps in the formation of source/drain contacts and conductive plugs of the semiconductor device 1200, according to some embodiments.
Figure 10B:
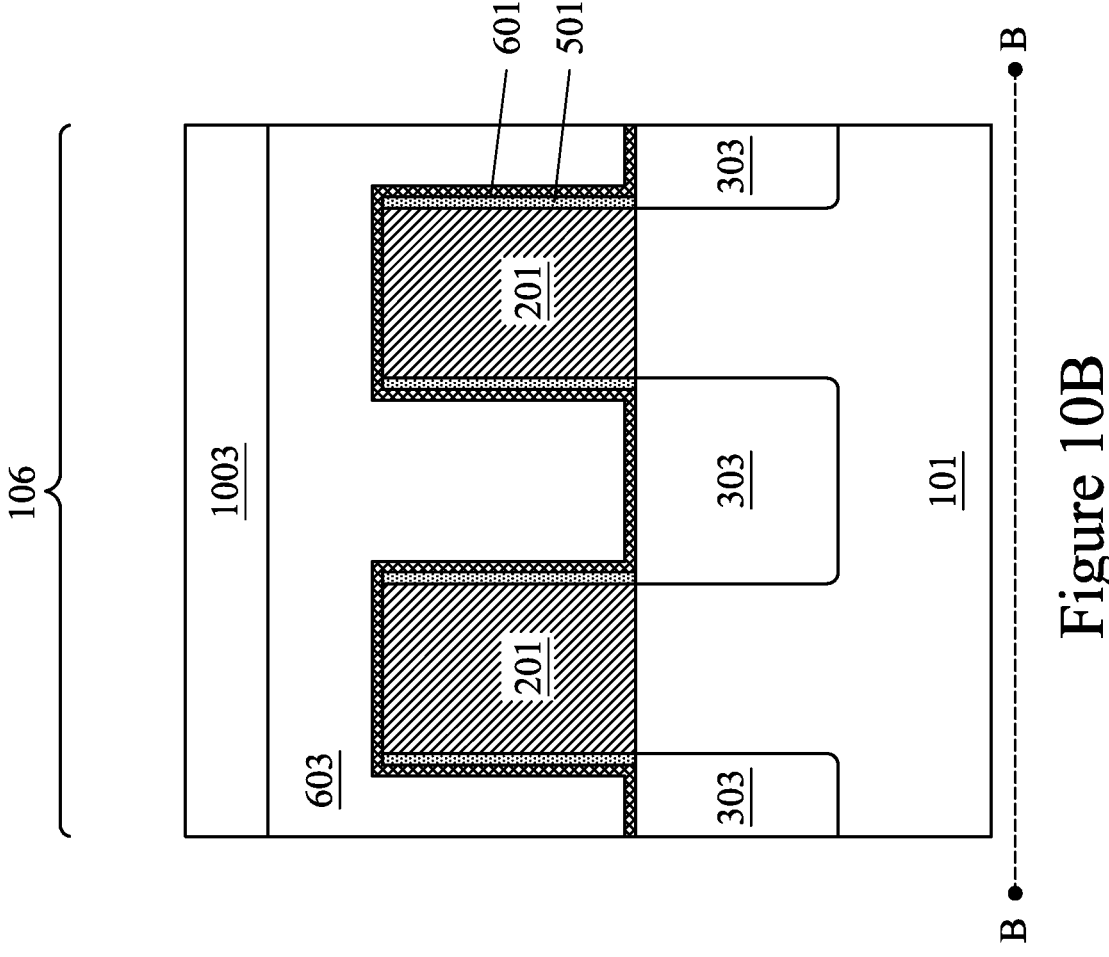
Figure 10C:
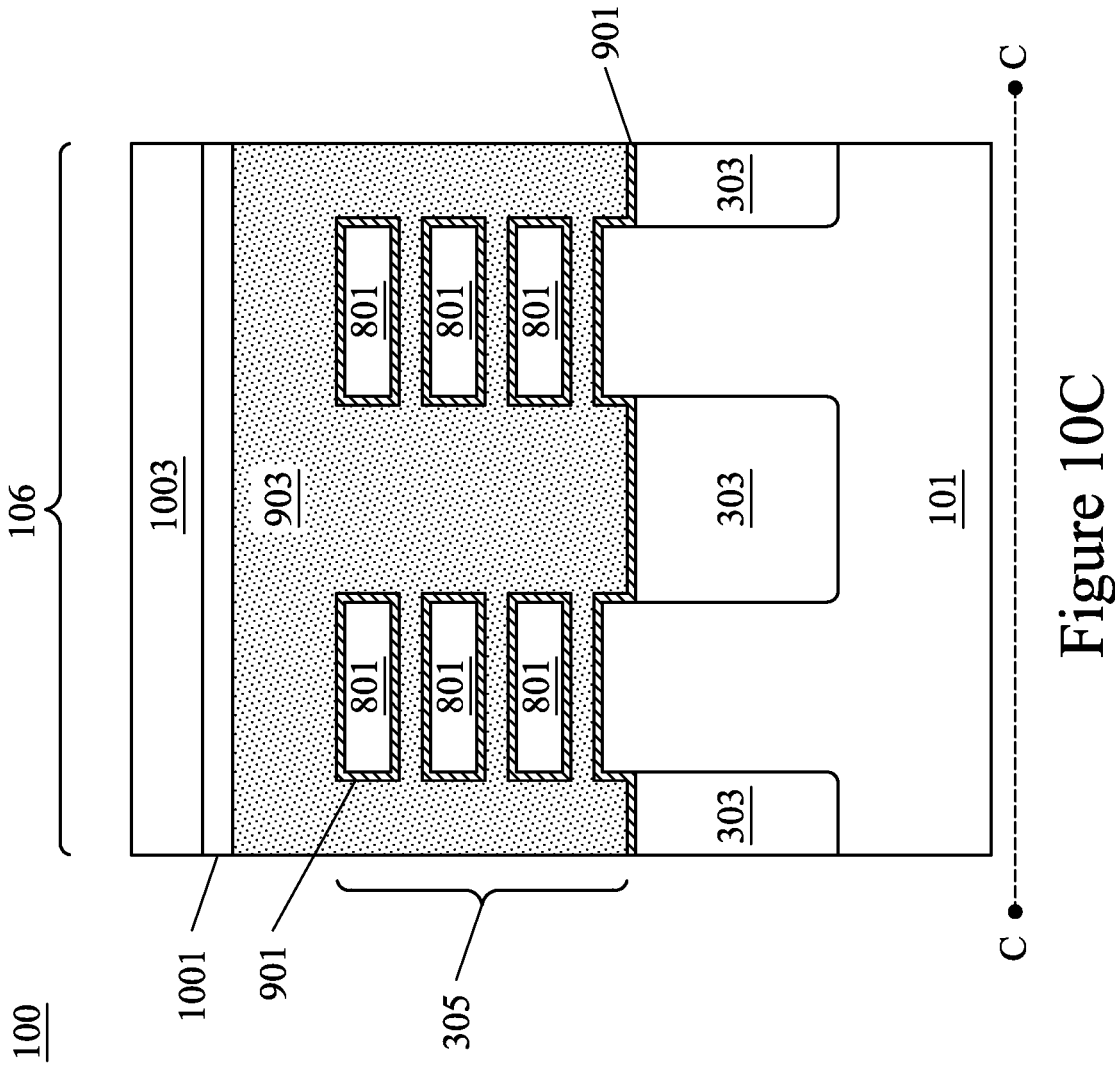

Turning to FIGS. 10A-10C, these figures illustrate recessing of the gate contacts 903 and deposition of a dielectric capping layer 1001, according to some embodiments. Once the gate contacts 903 have been formed, the materials of the gate contacts 903 and the gate dielectric 901 may be recessed below the planarized surfaces of the first interlayer dielectric 603. Once recessed, a dielectric capping layer 1001 may be formed within the recesses and then planarized with the first interlayer dielectric 603. In an embodiment the dielectric capping layer 1001 may be a dielectric material such as a silicon nitride layer or a high-k dielectric layer formed using a deposition process such as CVD, ALD, PVD, combinations of these, or the like. Once formed, the dielectric capping layer 1001 may be planarized using a planarization process such as a chemical mechanical polishing process. According to some embodiments, the first spacer layer 501 and/or the contact etch stop layer 601 may be recessed along with the gate dielectric 901 and the gate contact 903. In such embodiments, the dielectric capping layer 1001 is formed over the tops of the first spacer layer 501 and the contact etch stop layer 601 as well as the gate dielectric 901 and the gate contact 903.

FIGS. 10A-10C further illustrate the formation of a second interlayer dielectric 1003 may be formed by depositing a dielectric material over the first device region 106 and the second device region 108. The second interlayer dielectric 1003 may be formed and planarized using any of the processes and materials suitable for forming the first interlayer dielectric 603, as set forth above.

Figure 11A:
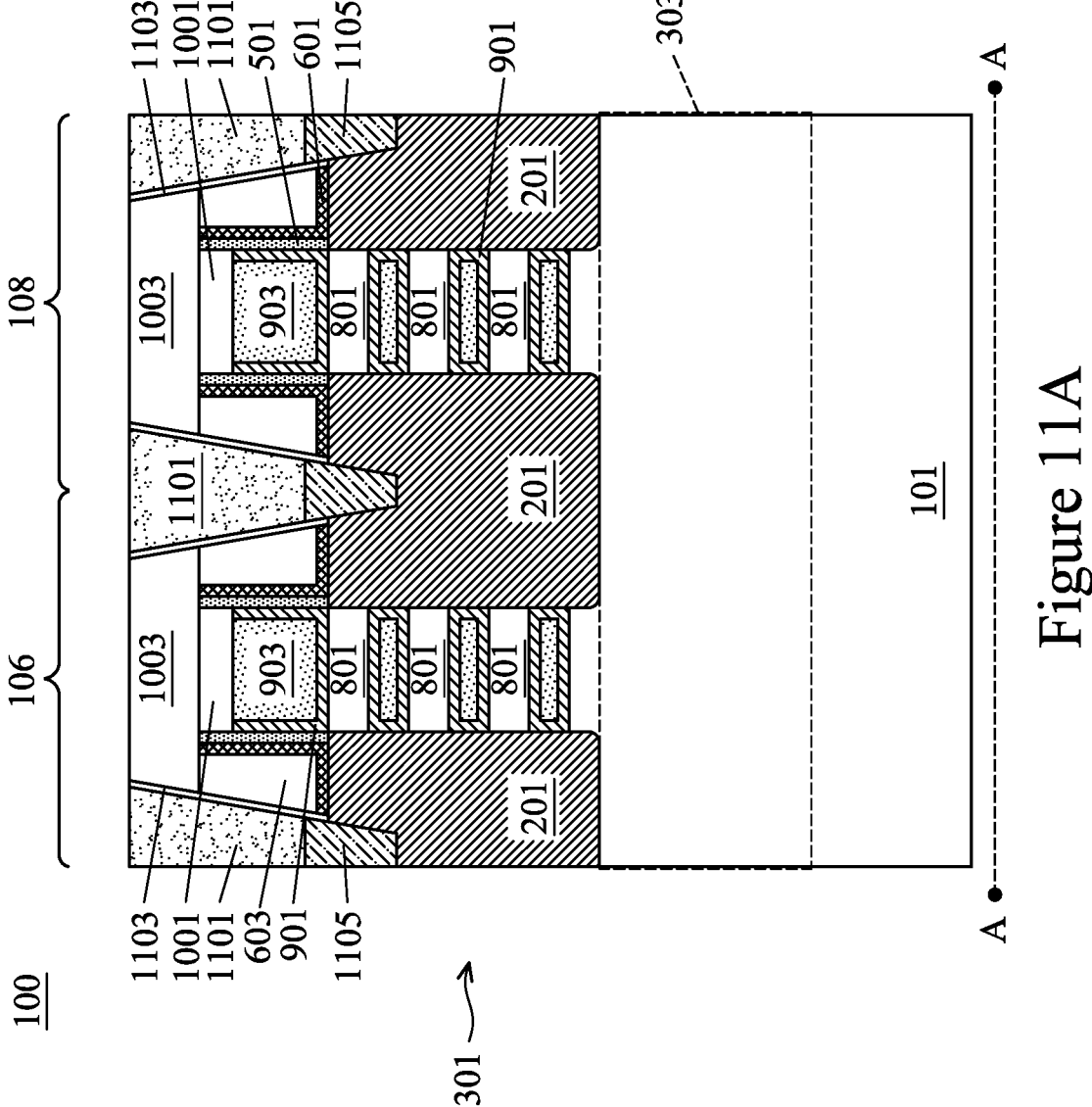
Figure 11B:
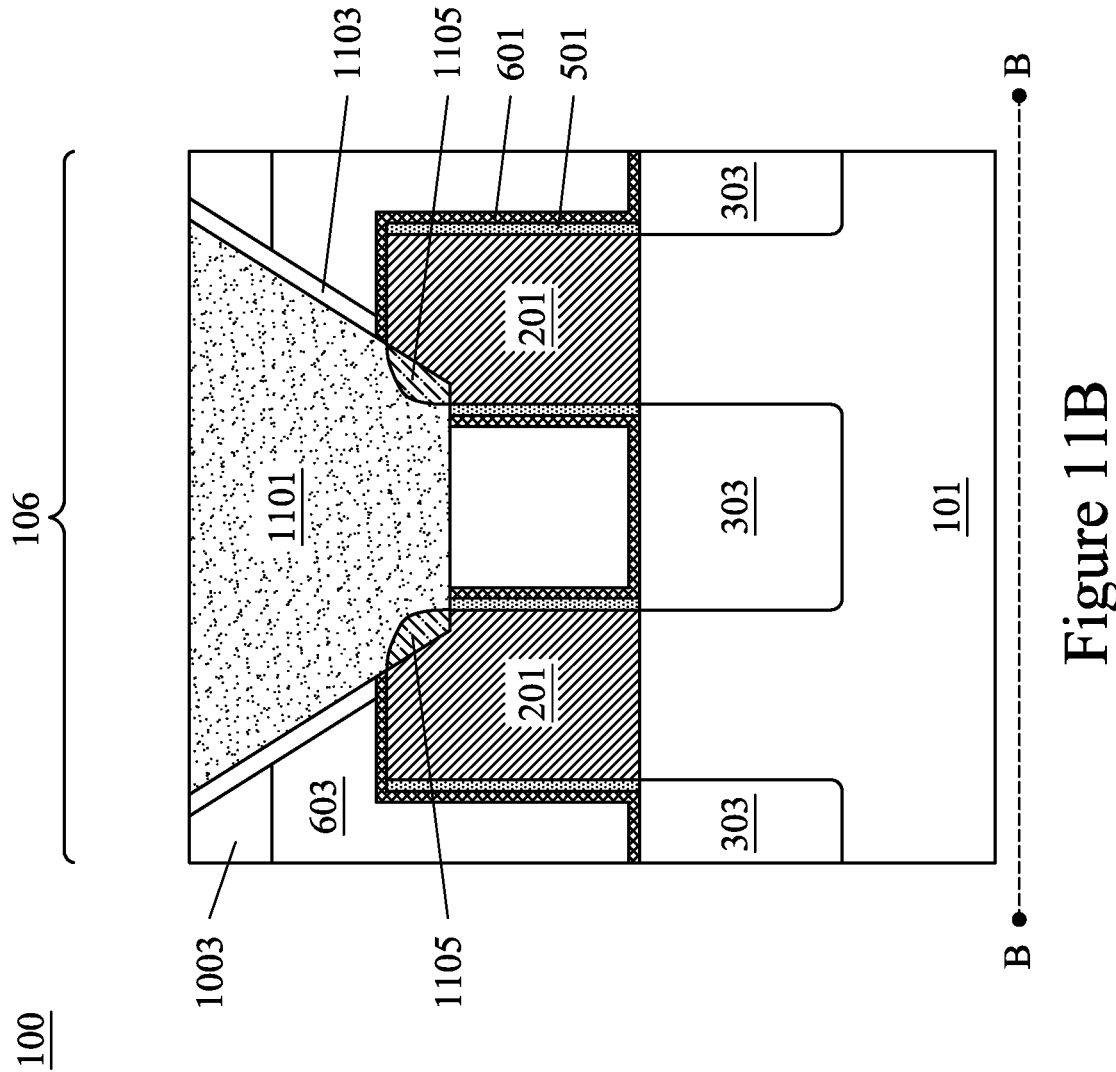

Continuing to FIGS. 11A and 11B, these figures illustrate the formation of source/drain contacts 1101, according to some embodiments. In some embodiments, the steps for forming the source/drain contacts 1101 in the first device region 106 are performed separately from the steps for forming the source/drain contacts 1101 in the second device region 108, although some or all of the steps may be performed together.

In an initial step in forming the source/drain contacts 1101, the second interlayer dielectric 1003, the first interlayer dielectric 603, and the contact etch stop layer 601 are etched to form openings over and exposing surfaces of the source/drain regions 201. These openings may be formed by etching using an anisotropic etching process, such as reactive ion etching (RIE), neutral beam etch (NBE), or the like. In some embodiments, the openings may be etched through the second interlayer dielectric 1003 and the first interlayer dielectric 603 using a first etching process and may then be etched through the contact etch stop layer 601 using a second etching process. A mask, such as a photoresist, may be formed and patterned over the second interlayer dielectric 1003 to mask portions of the second interlayer dielectric 1003 from the first etching process and the second etching process.

According to some embodiments, a protection layer 1103 may be formed along sidewalls of the openings in the second interlayer dielectric 1003, the first interlayer dielectric 603, and the contact etch stop layer 601. In some embodiments, a dielectric material may be deposited as a conformal layer over the second interlayer dielectric 1003 and in the openings such that the dielectric material conforms to the exposed surfaces of the source/drain regions 201 and along sidewalls of the openings. The conformal layer of the dielectric material may be formed by thermal oxidation or deposited by chemical vapor deposition (CVD), atomic layer deposition (ALD), or the like and may be formed of silicon oxide, silicon nitride, silicon oxynitride, or the like. Once deposited, the conformal layer of the dielectric material may be etched using a suitable etching process such as anisotropic etching (e.g., a dry etch process) or the like to remove the dielectric material from the top surface of the second interlayer dielectric 1003 and to re-expose the source/drain regions 201 within the openings. As illustrated in FIGS. 11A and 11B, the remaining portions of the dielectric material along the sidewalls of the openings form the protection layer 1103.

According to some embodiments, the material of the source/drain regions 201 is etched to extend the openings into the source/drain regions 201. In some embodiments, the source/drain regions 201 may be etched by an anisotropic etching process such as reactive ion etching (RIE), neutral beam etch (NBE), or the like. The source/drain regions 201 may be etched by an iterative etching process different from the etching process used to etch the first interlayer dielectric 603, the second interlayer dielectric 1003, and the contact etch stop layer 601.

FIGS. 11A and 11B further illustrate the formation of silicide contacts 1105, according to some embodiments, in order to reduce the Schottky barrier height of the source/drain contacts 1101. In some embodiments, the silicide contacts 1105 are formed using a material such as titanium, nickel, cobalt, or erbium. However, other metals, such as platinum, palladium, and the like, may also be used. The silicidation may be performed by blanket deposition of an appropriate metal layer, followed by an annealing step which causes the metal to react with the underlying exposed silicon of the source/drain regions 201. Un-reacted metal is then removed, such as with a selective etch process. The thickness of the silicide contacts 1105 may be between about 5 nm and about 50 nm. However, any suitable thickness may be used.

In an embodiment, the source/drain contacts 1101 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the openings using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP). However, any suitable material and process of formation may be utilized.

In addition, FIG. 11A further illustrates that some of the source/drain regions 201 may be shared between the first device region 106 and the second device region 108, according to some embodiments. Furthermore, the shared source/drain region 201 may be electrically connected by one of the source/drain contacts 1101 and one of the silicide contacts 1105 for external connection. FIG. 11B further illustrates that the source/drain contact 1101 in the first device region 106 may be sized to span between and electrically connect two of the source/drain regions 201 in the first device region 106, according to some embodiments. The silicide contacts 1105 are formed at the interfaces of each of the source/drain regions 201. However, in some other embodiments, separate ones of the source/drain contacts 1101 and separate ones of the silicide contacts 1105 may be formed to each of the source/drain regions 201.

Figure 12A:
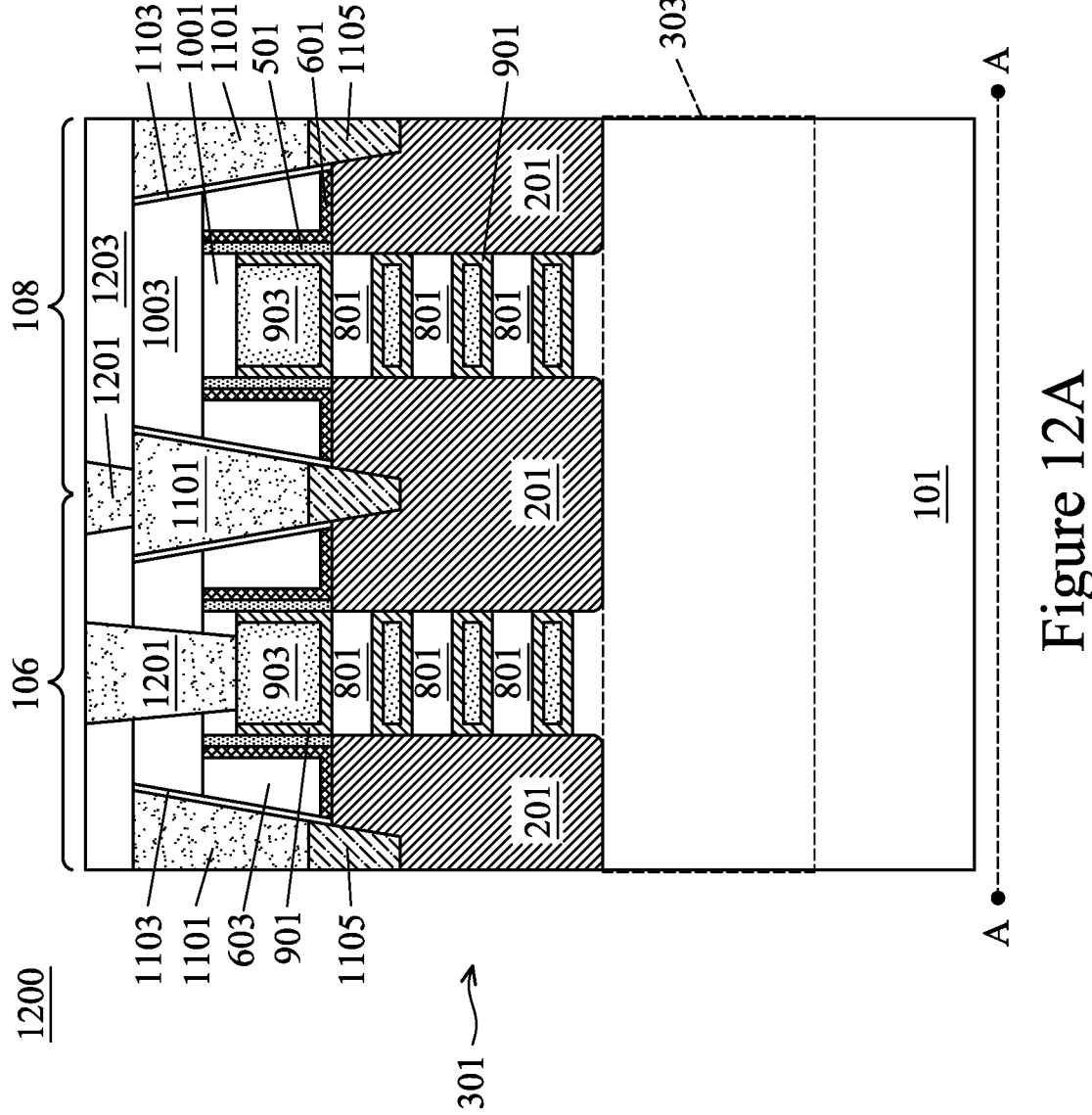
Figure 12B:
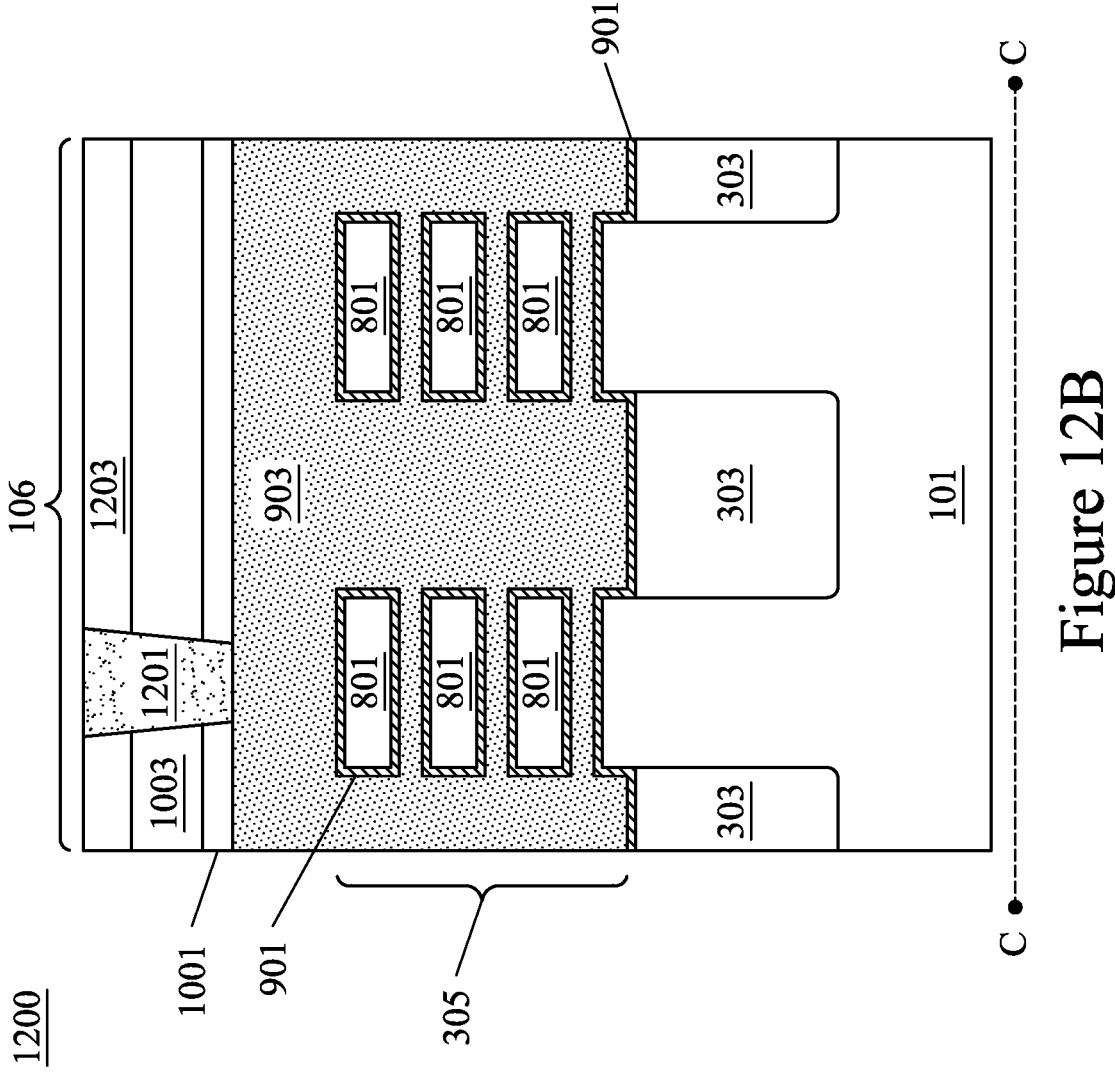

Turning to FIGS. 12A and 12B, these figures illustrate a formation of conductive plugs 1201 to the source/drain contacts 1101 and the gate contacts 903 of a semiconductor device 1200, according to some embodiments. According to some embodiments, the semiconductor device 1200 may be a gate all around (GAA) device. However, other suitable devices may also be used. The conductive plugs 1201 may be formed by initially forming a third interlayer dielectric layer 1203 over the second interlayer dielectric 1003 and the source/drain contacts 1101 of the first device region 106 and the second device region 108. The third interlayer dielectric layer 1203 may be formed using any of the materials and methods suitable for forming and planarizing the first interlayer dielectric layer 603 as set forth above.

Additionally, after formation, conductive plugs 1201 may be formed through the third interlayer dielectric layer 1203 and the dielectric capping layer 1001 to provide electrical connectivity. In an embodiment the conductive plugs 1201 may be formed by initially forming a first opening through the third interlayer dielectric layer 1203 over the source/drain contacts 1101 and forming a second opening through the second interlayer dielectric 1003 and through the dielectric capping layer 1001 over the gate contacts 903 using, e.g., a masking and etching process. Once the openings have been formed, conductive material, such as copper, may be deposited to fill and/or overfill the openings using a deposition process such as plating, chemical vapor deposition, sputtering, combinations of these, or the like. Excess material may then be removed using, for example, a planarization process such as chemical mechanical planarization, or the like.

A replacement polysilicon gate (RPG) loop process or a multi patterning gate (MPG) loop process may be used to pattern FinFET gate electrodes. The RPG or MPG loop may adversely damage the gate by undesirably reducing the gate height. In traditional nano-sheet FinFET process, a source/drain epi layer, which is formed prior to nano-sheets to prevent a crash of the nano-sheets, may degrade the accuracy of optical critical-dimension (OCD) measurement. A test pattern prior to a source/drain epi layer is useful for RPG and MPG loop to control gate height and bias voltage (Vt). The present embodiments provide one or more of the following advantages. The source/drain regions 201 are formed as homogenous blocks of silicon, according to some embodiments. Furthermore, the source/drain regions 201 may be formed prior to forming the fins 301. During the wire release process and further processing of the nanostructures 801 within the channel regions 305, the source/drain regions 201 provide support for the nanostructures 801. As such, undesirable destruction of the nanostructures 801 (e.g., due to nanosheet crashing during the wire release process) may be prevented, even in embodiments where the nanostructures 801 span distances greater than 30 nm. Furthermore, highly accurate measurements of critical dimensions of the nanostructures 801 can be made during formation (e.g., using in-line optical critical-dimension (OCD) monitoring) with little to no noise caused by later variations during the source/drain epitaxial growth process. As such, these highly accurate critical dimensions can be used to help control process parameters (e.g., bias voltage (Vt), etching pressures, etching times, and/or the like) to control the formation of the nanostructures 801 (e.g., during wire release) and/or to control the gate height during the formation of the gate dielectric 901 and gate contact 903. Furthermore, these critical dimensions can also be used as feedback to improve the process recipe and maintain uniformity of the fabrication of subsequently formed wafers within a batch. Additionally, the processes described herein can be integrated into other manufacturing processes (such as etching and growth processes for PMOS or other etching and growth processes) so that no additional costs need to be added to the overall manufacturing process. Accordingly, the present disclosure provides robust OCD model in MPG loop and RPG loop without noise from source/drain epi process variation.

In accordance with an embodiment, a method includes: forming a multi-layer stack over a substrate, the multi-layer stack comprising a first layer, a second layer over the first layer, a third layer over the second layer, and a fourth layer over the third layer, the first layer and third layer comprising a first semiconductor material and the second layer and the fourth layer comprising a second semiconductor material; etching a first opening into the multi-layer stack and exposing the substrate through the first opening; forming a first source/drain region in the first opening; after forming the first source/drain region, etching a fin from the multi-layer stack; removing the first layer and the third layer from the fin; and forming a gate structure to surround the second layer and the fourth layer. In an embodiment the forming the first source/drain region further comprises depositing the second semiconductor material in the first opening. In an embodiment the second semiconductor material is silicon. In an embodiment the forming the gate structure forms the gate structure in physical contact with the first source/drain region. In an embodiment the first source/drain region is shaped as a rectangle in a top down view. In an embodiment the forming the first source/drain region comprises epitaxially growing the first source/drain region. In an embodiment the first source/drain region has a first width and the fin has the first width.

In accordance with another embodiment, a method includes: forming a first opening in a multi-layer structure; forming a first source/drain region in the first opening; etching the multi-layer structure to form a fin after the forming the first source/drain region; performing a wire release process on the fin to form nanostructures; and depositing a gate structure around each of the nanostructures after the performing the wire release process. In an embodiment the forming the first source/drain region comprises depositing a silicon material in the first opening. In an embodiment the wire release process includes using a selective etching process to remove a first semiconductor material from the fin, the first semiconductor material being different from a semiconductor material of the each remaining layer of the multi-layer structure. In an embodiment the first source/drain region has a straight sidewall from a top of the first source/drain region to a bottom of the first source/drain region. In an embodiment the fin has a first width and the first source/drain region has the first width. In an embodiment the first source/drain region comprises a first material and the nanostructures comprise the first material. In an embodiment the method further includes forming an isolation region adjacent to the first source/drain region after the etching the multi-layer structure.

In accordance with yet another embodiment, a semiconductor device includes: a first source/drain region; a second source/drain region; a stack of nanostructures, each nanostructure within the stack of nanostructures extending between the first source/drain region and the second source/drain region; a gate dielectric layer surrounding each nanostructure within the stack of nanostructures, wherein the gate dielectric layer is in direct physical contact with the first source/drain region and the second source/drain region; and a gate contact surrounding the gate dielectric layer. In an embodiment the first source/drain region and the second source/drain region are silicon. In an embodiment a distance between the first source/drain region and the second source/drain region is at least 30 nm. In an embodiment the first source/drain region has a straight sidewall from a top of the first source/drain region to a bottom of the first source/drain region. In an embodiment the first source/drain region has a rectangular shape in a top down view. In an embodiment the stack of nanostructures has a first width and the first source/drain region has the first width The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a gate structure, the gate structure comprising:
     a gate dielectric surrounding a first nanostructure and a second nanostructure over a semiconductor substrate; and
     a gate electrode surrounding the gate dielectric;
   a first source/drain region in physical contact with the first nanostructure, the second nanostructure, and the gate dielectric, the first source/drain region extending into the semiconductor substrate a first distance of between about 10 nm and about 100 nm, wherein the first source/drain region has a substantially rectangular prism shape in a perspective view; and
   a gate spacer on a sidewall of the gate structure, wherein a lowermost surface of the gate spacer directly contacts an uppermost surface of the first source/drain region in a cross-sectional view, wherein the cross-sectional view extends through the first nanostructure and the second nanostructure in a channel length direction.

2. The semiconductor device of claim 1, wherein the first source/drain region has a first width, and the first nanostructure has the first width.

3. The semiconductor device of claim 1, wherein the gate dielectric has a first material throughout the gate dielectric.

4. The semiconductor device of claim 1, wherein the first source/drain region has a first length of between about 10 nm and about 40 nm.

5. The semiconductor device of claim 1, wherein the first source/drain region has a first height of between about 40 nm and about 300 nm.

6. The semiconductor device of claim 1, further comprising:
   an interlayer dielectric on opposing sides of the first source/drain region; and
   a spacer layer completely separating the first source/drain region from the interlayer dielectric.

7. The semiconductor device of claim 1, wherein the uppermost surface of the first source/drain region is lower than a lowermost surface of the gate dielectric in the cross-sectional view.

8. A semiconductor device comprising:
   a gate structure comprising a gate dielectric and a gate electrode;
   a first nanostructure over a semiconductor substrate;
   a second nanostructure separated from the first nanostructure by the gate dielectric and the gate electrode, the gate electrode surrounding each of the first nanostructure and the second nanostructure;

a first source/drain region at least partially embedded within the semiconductor substrate to a distance of between about 10 nm and about 100 nm, wherein an outer perimeter of the first source/drain region in a cross-sectional view has a rectangular shape, wherein an upper surface of the first source/drain region is substantially flat, wherein the upper surface of the first source/drain region is substantially co-planar with an upper surface of the second nanostructure, wherein the cross-sectional view is substantially parallel to a longitudinal axis of the gate electrode, wherein the rectangular shape extends from a point level with a bottom of the gate electrode to a point level with the upper surface of the second nanostructure;

a second source/drain region on an opposite side of the first nanostructure and the second nanostructure from the first source/drain region, wherein the second source/drain region is in physical contact with each of the first nanostructure, the second nanostructure, and the gate dielectric; and a gate spacer along a sidewall of the gate structure, wherein the gate spacer is directly on an uppermost surface of the first source/drain region, wherein the gate spacer is completely above the uppermost surface of the first source/drain region in a cross-sectional view, wherein the cross-sectional view extends through the first source/drain region and the second source/drain region.

9. The semiconductor device of claim 8, wherein the first nanostructure has a length of at least 30 nm.

10. The semiconductor device of claim 8, wherein the gate dielectric has a first material throughout the gate dielectric.

11. The semiconductor device of claim 8, further comprising a third source/drain region adjacent to the first source/drain region, the first source/drain region and the third source/drain region having a pitch of between about 40 nm and about 180 nm.

12. The semiconductor device of claim 8, wherein the first source/drain region has a first length of between about 10 nm and about 200 nm.

13. The semiconductor device of claim 8, wherein the first source/drain region has a first height of between about 24 nm and about 60 nm.

14. The semiconductor device of claim 8, further comprising:

a spacer layer completely covering a sidewall of the first source/drain region.

15. A semiconductor device comprising:

a first epitaxial source/drain region;

a second epitaxial source/drain region, wherein an upper surface of the first epitaxial source/drain region is substantially co-planar with an upper surface of the second epitaxial source/drain region;

a stack of nanostructures, each nanostructure within the stack of nanostructures extending between the first epitaxial source/drain region and the second epitaxial source/drain region, wherein a first plane extends through the first epitaxial source/drain region, the second epitaxial source/drain region and the stack of nanostructures, wherein the first epitaxial source/drain region has a consistent width in a second plane for an entire height of the first epitaxial source/drain region, wherein the second plane is perpendicular to the first plane;

a gate structure comprising a gate dielectric layer and a gate electrode over the gate dielectric layer, the gate dielectric layer surrounding each nanostructure within the stack of nanostructures, wherein the gate dielectric layer is in direct physical contact with the first epitaxial source/drain region and the second epitaxial source/drain region; and a gate spacer adjacent the gate structure, an entirety of the gate spacer being over an uppermost surface of the first epitaxial source/drain region in a cross-sectional view along a gate length direction of the gate structure.

16. The semiconductor device of claim 15, wherein the first epitaxial source/drain region and the second epitaxial source/drain region are silicon.

17. The semiconductor device of claim 15, wherein a distance between the first epitaxial source/drain region and the second epitaxial source/drain region is at least 30 nm.

18. The semiconductor device of claim 15, wherein the first epitaxial source/drain region has a rectangular shape in a top down view.

19. The semiconductor device of claim 15, wherein the stack of nanostructures has a first width and the first epitaxial source/drain region has the first width.

20. The semiconductor device of claim 15, further comprising:

a third epitaxial source/drain region spaced apart from the first epitaxial source/drain region;

an interlayer dielectric over and between the first epitaxial source/drain region and the third epitaxial source/drain region; and a contact extending through the interlayer dielectric to the first epitaxial source/drain region and the third epitaxial source/drain region, wherein the interlayer dielectric contacts a bottom of the contact between the first epitaxial source/drain region and the third epitaxial source/drain region.

* * * * *